(12) United States Patent
Hayami

(10) Patent No.: US 6,940,431 B2
(45) Date of Patent: Sep. 6, 2005

(54) METHOD AND APPARATUS FOR MODULATING AND DEMODULATING DIGITAL DATA

(75) Inventor: Atsushi Hayami, Yokohama (JP)

(73) Assignee: Victor Company of Japan, Ltd., Yokohama (JP)

(*) Notice: Subject to any disclaimer, the term of this patent is extended or adjusted under 35 U.S.C. 154(b) by 0 days.

(21) Appl. No.: 10/885,320

(22) Filed: Jul. 7, 2004

(65) Prior Publication Data

US 2005/0046602 A1 Mar. 3, 2005

(30) Foreign Application Priority Data

Aug. 29, 2003 (JP) .......................................... 2003-305758

(51) Int. Cl.[7] .............................................. H03M 7/20
(52) U.S. Cl. .......................................... 341/102; 341/50
(58) Field of Search ........................... 341/102, 50, 59, 341/67, 58; 714/800

(56) References Cited

U.S. PATENT DOCUMENTS

| | | | | |
|---|---|---|---|---|
| 5,633,632 A | * | 5/1997 | Ido et al. ....................... | 341/58 |
| 6,653,952 B2 | * | 11/2003 | Hayami et al. ............... | 341/59 |
| 6,690,308 B2 | * | 2/2004 | Hayami ....................... | 341/68 |
| 2002/0118125 A1 | * | 8/2002 | Noda et al. ................... | 341/58 |
| 2003/0002184 A1 | * | 1/2003 | Hayami et al. ............... | 360/29 |
| 2004/0184555 A1 | * | 9/2004 | Kayanuma ................... | 375/295 |

FOREIGN PATENT DOCUMENTS

| | | |
|---|---|---|
| JP | 06-195887 | 7/1994 |
| JP | 10-340543 | 12/1998 |
| JP | 2000-105981 | 4/2000 |

OTHER PUBLICATIONS

IEEE article "DC–Free (d, k) Constrained Low Density Parity Check (LDPC) odes", ISOM/ODS 2002 (Joint International Symposium on Optical Memory and Optical Data Storage Topical Meeting 2002), Technial Digest, pp 377–379, by Hongwei Song, Jingfeng Liu and B. V. K. Vijaya Kumar no month.
Portions of Japanese book *LDPC (Low Density Parity Check) Codes/Sum–Product Decoding Method* by I. Wadayama, published by Triceps in 2002, pp. 31–33 and 92–95. English explanation of the portions submitted is given in the specification of the instant application, no month.

* cited by examiner

*Primary Examiner*—Peguy JeanPierre
(74) *Attorney, Agent, or Firm*—Louis Woo

(57) ABSTRACT

A succession of input data words is converted into a first succession of information code words including first candidate one and a second succession of information code words including second candidate one different from first candidate one. One is selected from the first succession of information code words and the second succession of information code words as a final succession of information code words in a manner such that the absolute value of a DSV relating to the final information-code-word succession will be smaller. Check bits are generated in response to the final information-code-word succession and a predetermined parity generation matrix of LDPC encoding. The check bits are changed to conversion code words. The final information-code-word succession and the conversion code words are combined into an output-code-word sequence which obeys (1, k) RLL, where "k" is a predetermined natural number in the range of 9 to 12.

10 Claims, 17 Drawing Sheets

FIG. 3

| DECIMAL | BINARY |
|---|---|
| 0 | 000000 |
| 1 | 000001 |
| 2 | 000010 |
| 4 | 000100 |
| 5 | 000101 |
| 8 | 001000 |
| 9 | 001001 |
| 10 | 001010 |
| 16 | 010000 |
| 17 | 010001 |
| 18 | 010010 |
| 20 | 010100 |
| 21 | 010101 |
| 32 | 100000 |
| 33 | 100001 |
| 34 | 100010 |
| 36 | 100100 |
| 37 | 100101 |
| 40 | 101000 |
| 41 | 101001 |
| 42 | 101010 |

FIG. 4

| ID (S now) | 0 | | 1 | | 2 | | 3 | |
|---|---|---|---|---|---|---|---|---|
| D (k) | C (k) | S next | C (k) | S next | C (k) | S next | C (k) | S next |
| 0 | 1 | 000001 | 0 | 9 | 001001 | 0 | 33 | 100001 | 0 | 41 | 101001 | 0 |
| 1 | 1 | 000001 | 1 | 9 | 001001 | 1 | 33 | 100001 | 1 | 41 | 101001 | 1 |
| 2 | 17 | 010001 | 0 | 5 | 000101 | 0 | 17 | 010001 | 0 | 37 | 100101 | 0 |
| 3 | 17 | 010001 | 1 | 5 | 000101 | 1 | 17 | 010001 | 1 | 37 | 100101 | 1 |
| 4 | 18 | 010010 | 1 | 2 | 000010 | 1 | 18 | 010010 | 1 | 34 | 100010 | 1 |
| 5 | 18 | 010010 | 2 | 2 | 000010 | 2 | 18 | 010010 | 2 | 34 | 100010 | 2 |
| 6 | 18 | 010010 | 3 | 2 | 000010 | 3 | 18 | 010010 | 3 | 34 | 100010 | 3 |
| 7 | 21 | 010101 | 0 | 4 | 000100 | 1 | 36 | 100100 | 1 | 21 | 010101 | 0 |
| 8 | 21 | 010101 | 1 | 4 | 000100 | 2 | 36 | 100100 | 2 | 21 | 010101 | 1 |
| 9 | 20 | 010100 | 2 | 4 | 000100 | 3 | 36 | 100100 | 3 | 20 | 010100 | 1 |
| 10 | 20 | 010100 | 3 | 10 | 001010 | 1 | 42 | 101010 | 1 | 20 | 010100 | 2 |
| 11 | 20 | 010100 | 2 | 10 | 001010 | 2 | 40 | 101000 | 2 | 20 | 010100 | 3 |
| 12 | 0 | 000000 | 3 | 10 | 001010 | 3 | 42 | 101010 | 3 | 32 | 100000 | 2 |
| 13 | 0 | 000000 | 3 | 8 | 001000 | 1 | 42 | 101010 | 2 | 32 | 100000 | 3 |
| 14 | 16 | 010000 | 2 | 8 | 001000 | 2 | 40 | 101000 | 3 | 16 | 010000 | 2 |
| 15 | 16 | 010000 | 3 | 8 | 001000 | 3 | 40 | 101000 | 2 | 16 | 010000 | 3 |

FIG. 5

| LSB-SIDE ZERO RUN LENGTH OF WORD C (k) | ALLOWABLE 6-BIT PATTERNS TAKEN BY WORD C (k+1) FOR (1, 7) RLL | | | | | | |
|---|---|---|---|---|---|---|---|
| 6 | 1xxxxx | 01xxxx | | | | | |
| 5 | 1xxxxx | 01xxxx | 001xxx | | | | |
| 4 | 1xxxxx | 01xxxx | 001xxx | 0001xx | | | |
| 3 | 1xxxxx | 01xxxx | 001xxx | 0001xx | 00001x | | |
| 2 | 1xxxxx | 01xxxx | 001xxx | 0001xx | 00001x | 000001 | |
| 1 | 1xxxxx | 01xxxx | 001xxx | 0001xx | 00001x | 000001 | 000000 |
| 0 | xxxxxx | 1xxxxx | 01xxxx | 001xxx | 0001xx | 00001x | 000001 000000 |

FIG. 6

| INPUT DATA WORD | CURRENT-TABLE SELECTION NUMBER | | DSV (NRZI) | | SELECTED INFORMATION WORD | NEXT-TABLE SELECTION NUMBER |
|---|---|---|---|---|---|---|
| D (k) | S nowa | S nowb | C (k) a | C (k) b | C (k) | S next |
| | C (k) a | C (k) b | | | LSB-SID ZERO RUN LENGTH | |
| 4 | 0 | – | (-1) | +1 | 18=010010 | 1 |
| | 18=010010 | – | | | 1 | |
| 5 | 1 | – | (+3) | -3 | 2=000010 | 2 |
| | 2=000010 | – | | | 1 | |
| 1 | 2 | 0 | +7 | (-3) | 9=000001 | 1 |
| | 33=100001 | 1=000001 | | | 0 | |
| 2 | 1 | – | +5 | (-1) | 5=000101 | 0 |
| | 5=0000101 | – | | | 0 | |
| 15 | 0 | – | +7 | (-3) | 16=010000 | 3 |
| | 16=010000 | – | | | 4 | |
| 3 | 3 | 1 | (-3) | -5 | 37=100101 | 1 |
| | 37=100101 | 5=000101 | | | 0 | |
| 11 | 1 | – | (-1) | -7 | 10=001010 | 2 |
| | 10=001010 | – | | | 1 | |
| ⋮ | ⋮ | ⋮ | ⋮ | ⋮ | ⋮ | ⋮ |

FIG. 16

| C (k-1) | | | D (k-1) | | | |
|---|---|---|---|---|---|---|
| DECIMAL | BINARY | DECISION INFORMATION | S(k) = 0 | S(k) = 1 | S(k) = 2 | S(k) = 3 |
| 0 | 000000 | 2 | 7 | - | 12 | 13 |
| 1 | 000001 | 0 | 0 | 1 | - | - |
| 2 | 000010 | 1 | - | 4 | 5 | 6 |
| 4 | 000100 | 1 | - | 7 | 8 | 9 |
| 5 | 000101 | 0 | 2 | 3 | - | - |
| 8 | 001000 | 1 | - | 11 | 14 | 15 |
| 9 | 001001 | 0 | 0 | 1 | - | - |
| 10 | 001010 | 1 | - | 10 | 12 | 13 |
| 16 | 010000 | 2 | - | - | 14 | 15 |
| 17 | 010001 | 0 | 2 | 3 | - | - |
| 18 | 010010 | 1 | - | 4 | 5 | 6 |
| 20 | 010100 | 1 | - | 9 | 10 | 11 |
| 21 | 010101 | 0 | 7 | 8 | - | - |
| 32 | 100000 | 2 | - | - | 12 | 13 |
| 33 | 100001 | 0 | 0 | 1 | - | - |
| 34 | 100010 | 1 | - | 4 | 5 | 6 |
| 36 | 100100 | 1 | - | 7 | 8 | 9 |
| 37 | 100101 | 0 | 2 | 3 | - | - |
| 40 | 101000 | 1 | - | 11 | 14 | 15 |
| 41 | 101001 | 0 | 7 | 8 | - | - |
| 42 | 101010 | 1 | - | 10 | 12 | 13 |

FIG. 17

| DECISION INFORMATION (CASE) | LSB-SIDE ZERO RUN LENGTH OF C (k-1) | S (k) DESIGNATING TABLE USED TO GENERATE C (k) |
|---|---|---|
| 0 | 0 | 0, 1 |
| 1 | 1, 2, 3 | 1, 2, 3 |
| 2 | 4, 5, 6 | 2, 3 |

FIG. 18

| D (k) | C (k) | DECISION INFORMATION | S (k) |
|---|---|---|---|
| 15 | 010000 | 2 | 3 |
| 0 | 001001 | 0 | 0 |
| 1 | 000001 | 0 | 1 |
| 2 | 000101 | 0 | 0 |
| 3 | 010001 | 0 | - |

METHOD AND APPARATUS FOR MODULATING AND DEMODULATING DIGITAL DATA

BACKGROUND OF THE INVENTION

1. Field of the Invention

This invention relates to a method and an apparatus for modulating or encoding input digital data into DSV-controlled (digital sum value controlled) digital data including information code words and LDPC (low density parity check) code words. In addition, this invention relates to a method and an apparatus for demodulating or decoding LDPC-code-added digital data into original digital data.

2. Description of the Related Art

In general, modulation systems are used for recording digital information signals on recording mediums such as optical discs or magnetic discs. Some modulation systems encode an input data bit stream into an output data bit stream obeying (1, k) RLL which means run length limiting rules such that 1 to k successive bits of "0" should be between bits of "1". The output data bit stream is recorded on a recording medium. Especially, (1, 7) RLL is the most commonly employed.

The direct-current (DC) component of a (1, 7) RLL information bit stream causes the spectrum of the information bit stream to enter the servo-signal band so that the servo control implemented by a recording-medium drive apparatus (an optical-disc drive apparatus) may be impaired. This problem can be solved by the DSV (digital sum value) control for converging the DSV (digital sum value) of the information bit stream on zero. The DSV convergence on zero results in the suppression of the DC component of the information bit stream.

Japanese patent application publication number 6-195887/1994 discloses a modulation apparatus which receives an information signal divided into sync blocks. Each sync block has a sequence of 174 bytes. In each sync block, the two former bytes are assigned to a sync signal, and the next two bytes are assigned to an ID signal. The remaining 170 bytes are assigned to data (information). The modulation apparatus in Japanese patent application 6-195887/1994 processes the information signal sync-block by sync-block. The processing of the information signal includes pre-coding. Specifically, for each sync block, the modulation apparatus inverts all bits in even-numbered data bytes while keeping unchanged sync bytes, ID bytes, and odd-numbered data bytes. The modulation apparatus combines the inversion-resultant even-numbered data bytes, the sync bytes, the ID bytes, and the odd-numbered data bytes into a pre-coded data bit stream. The modulation apparatus includes a modulation circuit for subjecting the pre-coded data bit stream to (1, 7) RLL modulation to get a modulation-resultant bit stream. The modulation apparatus may invert all bits in even-numbered ID and data bytes while keeping unchanged sync bytes and odd-numbered ID and data bytes. The pre-coding results in the suppression of DC component of the modulation-resultant bit stream.

Japanese patent application publication number 10-340543/1998 discloses an encoding apparatus having a DSV control function. The encoding apparatus in Japanese patent application 10-340543/1998 periodically designates 3 successive bits in a basic (1, 7) RLL data bit stream as an object to be converted for DSV control. The bit in the basic data bit stream which immediately precedes the 3-bit object is defined as a former reference bit. The bit in the basic data bit stream which immediately follows the 3-bit object is defined as a later reference bit. In addition, 6 successive bits immediately following the 3-bit object is defined as a reference bit set. The encoding apparatus converts the 3-bit object into first and second candidate 6-bit DSV control code words in response to the logic states of the former and later reference bits and also the logic state of the reference bit set by referring to a conversion table. Thereby, the encoding apparatus changes the basic data bit stream into first and second conversion-result data bit streams inclusive of the first and second candidate DSV control code words respectively. The encoding apparatus calculates the DSV's of the first and second conversion-result data bit streams up to a bit place significantly later than the positions of the first and second candidate DSV control code words, and compares the calculated DSV's. In accordance with the result of the comparison, the encoding apparatus selects one from the first and second conversion-result data bit streams as a final conversion-result bit stream. In this way, the encoding apparatus implements the DSV control for suppressing the DC component of the final conversion-result bit stream. The conversion of the 3-bit object into the first and second candidate 6-bit DSV control code words is designed so that also the final conversion-result bit stream will obey (1, 7) RLL.

Japanese patent application publication number 2000-105981 discloses a data conversion apparatus which implements 8-12 modulation and DSV control. According to the 8-12 modulation, an input digital signal is divided into 8-bit segments referred to as input code words, and every 8-bit input code word is converted into a 12-bit output code word. A conversion table is used for the conversion of the 8-bit input code word into the 12-bit output code word. The resultant output code words are serially connected to form a word sequence in the shape of a bit stream. In Japanese patent application 2000-105981, the 8-12 modulation is designed so that the output-code-word bit stream will obey (1, 8) RLL. Furthermore, the data conversion apparatus detects every special bit in the output-code-word bit stream, the logic-state inversion of which will not cause the violation of (1, 8) RLL. The data conversion apparatus changes the output-code-word bit stream into a first candidate output bit stream in which the detected special bit remains in its original logic state and a second candidate output bit stream in which the logic state of the detected special bit is inverted from the original. At the time position of a next special bit, the DSV's of the first and second candidate output bit streams are calculated. The absolute values of the calculated DSV's are compared. One of the first and second candidate output bit streams which corresponds to the smaller of the absolute values of the calculated DSV's is selected as a final output bit stream. In this way, the data conversion apparatus implements the DSV control for suppressing the DC component of the final output-code-word bit stream.

Hongwei Song, Jingfeng Liu, and B. V. K. Vijaya Kumar have reported "DC-Free (d, k) Constrained Low Density Parity Check (LDPC) Codes", ISOM/ODS 2002 (Joint International Symposium on Optical Memory and Optical Data Storage Topical Meeting 2002), Technical Digest 2002 IEEE, pages 377–379. According to the report, a DC-free (1, 7) RLL LDPC code is constructed for low signal-to-noise ratio and high-density recording of data on a recording medium. Specifically, the DC-free (1, 7) RLL LDPC code is generated as follows. The user information bits are first passed through a conventional (1, 7) RLL encoder, and the resultant (1, 7) RLL coded sequence goes through a conventional LDPC encoder. Since the LDPC encoder can be easily made systematic, the information bit part of the LDPC code word satisfies (1, 7) RLL. The resultant LDPC coded sequence is encoded by an extended bit insertion encoder. The extended bit insertion encoder multiplexes the parity check bits with the information bits. Specifically, the extended bit insertion encoder groups the parity check bits into two bits per group and inserts them periodically into the information bits which already satisfy (1, 7) RLL. In more detail, the extended bit insertion encoder groups the parity check bits as two bits P1 and P2 in one group and places a control bit B between the two parity check bits P1 and P2 to make sure that they do not violate "1" run length constraint. If both of the parity check bits P1 and P2 are "0", then the control bit B is set to "1". Otherwise, the control bit B is set to "0". Furthermore, the extended bit insertion encoder generates two control bits A1 and A2 placed immediately before each parity check and control bit set "P1-B-P2", and two control bits A3 and A4 placed immediately after the bit set "P1-B-P2". The control bits A1 and A4 are used primarily to ensure that (1, 7) RLL will not be violated. The control bits A2 and A3 are used to control the DC component. There is a straightforward method to control the DC component by selecting the value of the control bits A2 and A3 to control the value of the running digital sum (RDS).

Generally, LDPC codes are excellent in decoding performance and block error rate. Like turbo codes and RA (repeat and accumulate) codes, LDPC codes provide a near-Shannon capacity performance when the code length is great. In addition, LDPC codes hardly cause an error floor phenomenon.

Japanese book, entitled "LDPC (Low Density Parity Check) Codes/Sum-Product Decoding Method", written by T. Wadayama, published by Triceps in 2002, pages 31–33 and 92–95, discloses an LDPC encoding procedure and a log domain sum-product decoding algorithm. According to the Japanese book, LDPC encoding is implemented by multiplying an information vector and a generation matrix. Specifically, the generation matrix is predetermined, and the product of the information vector and the generation matrix makes LDPC code words. In the case of a systematic code, a parity check matrix for the code is held whose a right-upper triangular area is filled with elements of "0". A parity check symbol (an LDPC code word) can be derived from an information symbol by using the parity check matrix and iterating backward substitution. In more detail, a combination of the information symbol and the parity check symbol is defined as an output code word. Since the product of the output code word and the transposed version of the parity check matrix is equal to "0", there is obtained a system of linear equations in which the elements composing the parity check symbol are unknown variables. The linear equation system is solved by reiterating backward substitution, and hence the values of the elements composing the parity check symbol are found.

The log domain sum-product decoding algorithm in the foregoing Japanese book has a repeatable sequence of steps including an updating step and a parity check step. At the parity check step, a decision is made as to whether or not the product of a temporarily estimated code word and the transposed version of the parity check matrix is equal to "0". When it is decided that the product of the temporarily estimated code word and the transposed version of the parity check matrix is equal to "0", the temporarily estimated code word is outputted as a final estimated code word. Otherwise, return from the parity check step to the updating step is made, and the updating step updates the temporarily estimated code word.

As previously mentioned, the (1, 7) RLL LDPC code reported by H. Song et al is generated by inserting parity check bits and DC control bits into a sequence of information bits. The implementation of the DC control is difficult when the inserted parity check bits are in specified polarity conditions. Thus, to securely implement the DC control, it is necessary to increase the number of inserted DC control bits. The increase in the number of inserted DC control bits causes a drop in encoding rate.

SUMMARY OF THE INVENTION

It is a first object of this invention to provide an apparatus for modulating or encoding input digital data into (d, k) RLL DC-controlled LDPC-coded data at a high encoding rate.

It is a second object of this invention to provide a method of modulating or encoding input digital data into (d, k) RLL DC-controlled LDPC-coded data at a high encoding rate.

It is a third object of this invention to provide an improved apparatus for demodulating or decoding (d, k) RLL DC-controlled LDPC-coded data.

It is a fourth object of this invention to provide an improved method of demodulating or decoding (d, k) RLL DC-controlled LDPC-coded data.

A first aspect of this invention provides a modulating apparatus comprising a set of encoding tables; first means for modulating "m"-bit input data words into "n"-bit information code words respectively by referring to the encoding tables, wherein "m" denotes a first predetermined natural number equal to an integer multiple of 4 and "n" denotes a second predetermined natural number equal to an integer multiple of 6, and the number "n" is greater than the number "m"; wherein the encoding tables contain information code words assigned to input data words, and contain table selection information accompanying each information code word, wherein the table selection information designates one among the encoding tables which is used next to generate an information code word immediately following the information code word accompanied with the table selection information, and wherein information code words in first specified one of the encoding tables which are assigned to prescribed input data words are opposite in polarity of DSV (digital sum value) to information code words in second specified one of the encoding tables which are assigned to the prescribed input data words; second means for generating a final information code word in response to a current input data word different from the prescribed input data words by referring to one of the encoding tables; third means for generating a first candidate information code word in response to a current input data word equal to one of the prescribed input data words by referring to the first specified one of the encoding tables; fourth means for generating a second candidate information code word in response to the current input data word equal to said one of the prescribed input data words by referring to the second specified one of the encoding tables; fifth means for generating a first succession of information code words including the final information code word generated by the second means and the first candidate information code word generated by the third means; sixth means for generating a second succession of information code words including the final information code word generated by the second means and the second candidate information code word generated by the fourth means; seventh means for calculating a first DSV from the first succession of information code words which is generated by the fifth means; eighth means for calculating a second DSV from the second succession of information code words which is generated by the sixth means; ninth means for determining which of an absolute value of the first DSV calculated by the seventh means and an absolute value of the second DSV calculated by the eighth means is smaller; tenth means for selecting one from the first succession of information code words and the second succession of information code words which corresponds to the smaller DSV absolute value determined by the ninth means as at least a part of a final information-code-word sequence; eleventh means for generating check bits in response to every block of the final information-code-word sequence and a predetermined parity generation matrix of LDPC (low density parity check) encoding; twelfth means for converting the check bits generated by the eleventh means into conversion code words respectively, wherein each of the conversion code words includes three bits among which two bits are "0" and one bit is "1"; and thirteenth means for combining every block of the final information-code-word sequence and the related conversion code words generated by the twelfth means into an output-code-word sequence which obeys (1, k) RLL (run length limiting rules), where "k" is a predetermined natural number in the range of 9 to 12.

A second aspect of this invention is based on the first aspect thereof, and provides a modulating apparatus wherein a center bit in each of the conversion code words generated by the twelfth means is equal in logic state to a corresponding check bit.

A third aspect of this invention is based on the first aspect thereof, and provides a modulating apparatus further comprising fourteenth means for updating the first DSV and the second DSV in response to the conversion code words used by the thirteenth means.

A fourth aspect of this invention provides a modulating method comprising the steps of modulating "m"-bit input data words into "n"-bit information code words respectively by referring to a set of encoding tables, wherein "m" denotes a first predetermined natural number equal to an integer multiple of 4 and "n" denotes a second predetermined natural number equal to an integer multiple of 6, and the number "n" is greater than the number "m"; wherein the encoding tables contain information code words assigned to input data words, and contain table selection information accompanying each information code word, wherein the table selection information designates one among the encoding tables which is used next to generate an information code word immediately following the information code word accompanied with the table selection information, and wherein information code words in first specified one of the encoding tables which are assigned to prescribed input data words are opposite in polarity of DSV (digital sum value) to information code words in second specified one of the encoding tables which are assigned to the prescribed input data words; generating a final information code word in response to a current input data word different from the prescribed input data words by referring to one of the encoding tables; generating a first candidate information code word in response to a current input data word equal to one of the prescribed input data words by referring to the first specified one of the encoding tables; generating a second candidate information code word in response to the current input data word equal to said one of the prescribed input data words by referring to the second specified one of the encoding tables; generating a first succession of information code words including the final information code word and the first candidate information code word; generating a second succession of information code words including the final information code word and the second candidate information code word; calculating a first DSV from the first succession of information code words; calculating a second DSV from the second succession of information code words; determining which of an absolute value of the first DSV and an absolute value of the second DSV is smaller; selecting one from the first succession of information code words and the second succession of information code words which corresponds to the smaller DSV absolute value as at least a part of a final information-code-word sequence; generating check bits in response to every block of the final information-code-word sequence and a predetermined parity generation matrix of LDPC (low density parity check) encoding; converting the check bits into conversion code words respectively, wherein each of the conversion code words includes three bits among which two bits are "0" and one bit is "1"; and combining every block of the final information-code-word sequence and the related conversion code words into an output-code-word sequence which obeys (1, k) RLL (run length limiting rules), where "k" is a predetermined natural number in the range of 9 to 12.

A fifth aspect of this invention is based on the fourth aspect thereof, and provides a modulating method wherein a center bit in each of the conversion code words is equal in logic state to a corresponding check bit.

A sixth aspect of this invention is based on the fourth aspect thereof, and provides a modulating method further comprising the step of updating the first DSV and the second DSV in response to the conversion code words combined with the block of the final information-code-word sequence.

A seventh aspect of this invention provides a demodulating apparatus comprising first means for implementing a first step of generating an estimated code-word bit sequence from every block of an input-code-word sequence in response to parameters according to a Maximum A Posteriori Probability process, a second step of separating the estimated code-word bit sequence into estimated information code words and estimated conversion code words, a third step of decoding the estimated conversion code words into estimated check bits, a fourth step of performing predetermined operation among the estimated information code words, the estimated check bits, and a predetermined parity generation matrix of LDPC encoding, a fifth step of deciding whether the estimated information code words are correct or wrong in response to a result of the predetermined operation, a sixth step of, when the fifth step decides that the estimated information code words are wrong, updating the parameters and then repeating the first, second, third, fourth, and fifth step, and a seventh step of, when the fifth step decides that the estimated information code words are correct, defining the estimated information code words as recovered information code words; a decoding table in which output data words are assigned to information code words depending on table selection information; second means for detecting an LSB-side zero run length of a recovered information code word of interest; third means for reproducing table selection information, which has been used by a modulating side to generate an information code word corresponding to a recovered information code word immediately following the recovered information code word of interest, in response to the detected LSB-side zero run length and the recovered information code word immediately following the recovered information code word of interest; and fourth means for reading out an output data word corresponding to the recovered information code word of interest from the decoding table in response to the recovered information code word of interest and the table selection information reproduced by the third means.

An eighth aspect of this invention is based on the seventh aspect thereof, and provides a demodulating apparatus wherein the third step uses center bits in the respective estimated conversion code words as the estimated check bits.

A ninth aspect of this invention provides a demodulating method comprising the steps of 1) generating an estimated code-word bit sequence from every block of an input-code-word sequence in response to parameters according to a Maximum A Posteriori Probability process; 2) separating the estimated code-word bit sequence into estimated information code words and estimated conversion code words; 3) decoding the estimated conversion code words into estimated check bits; 4) performing predetermined operation among the estimated information code words, the estimated check bits, and a predetermined parity generation matrix of LDPC encoding; 5) deciding whether the estimated information code words are correct or wrong in response to a result of the predetermined operation; 6) when the step 5) decides that the estimated information code words are wrong, updating the parameters and then repeating the steps 1), 2), 3), 4), and 5); 7) when the step 5) decides that the estimated information code words are correct, defining the estimated information code words as recovered information code words; 8) detecting an LSB-side zero run length of a recovered information code word of interest; 9) reproducing table selection information, which has been used by a modulating side to generate an information code word corresponding to a recovered information code word immediately following the recovered information code word of interest, in response to the detected LSB-side zero run length and the recovered information code word immediately following the recovered information code word of interest; and 10) reading out an output data word corresponding to the recovered information code word of interest from a decoding table in response to the recovered information code word of interest and the table selection information reproduced by the step 9); wherein the decoding table contains output data words which are assigned to information code words depending on table selection information.

A tenth aspect of this invention is based on the eighth aspect thereof, and provides a demodulating method wherein the step 3) uses center bits in the respective estimated conversion code words as the estimated check bits.

BRIEF DESCRIPTION OF THE DRAWINGS

FIG. 3 is a diagram of 6-bit information code words used in encoding tables in FIGS. 1 and 2.

FIG. 4 is a diagram of the contents of the encoding tables in FIGS. 1 and 2.

FIG. 5 is a diagram of the relation between the LSB-side zero run length of an information code word and the bit patterns which a next information code word is allowed to take to keep (1, 7) RLL.

FIG. 6 is a diagram of an example of the relation among successive input data words, current-table selection numbers, DSV's, information code words, and a next-table selection number which occur in the 4-6 modulating section in FIG. 1.

FIG. 16 is a diagram of the contents of a decoding table in FIG. 15.

FIG. 17 is a diagram of the relation among decision information (case), the LSB-side zero run length of an information code word, and an encoding state corresponding to a next-table selection number which occur in the information demodulating apparatus of FIG. 15.

FIG. 18 is a diagram of an example of the relation among successive information code words, decision information, an encoding state, and successive output data words occurring in the information demodulating apparatus of FIG. 15.

DETAILED DESCRIPTION OF THE INVENTION

First Embodiment

Figure 1:
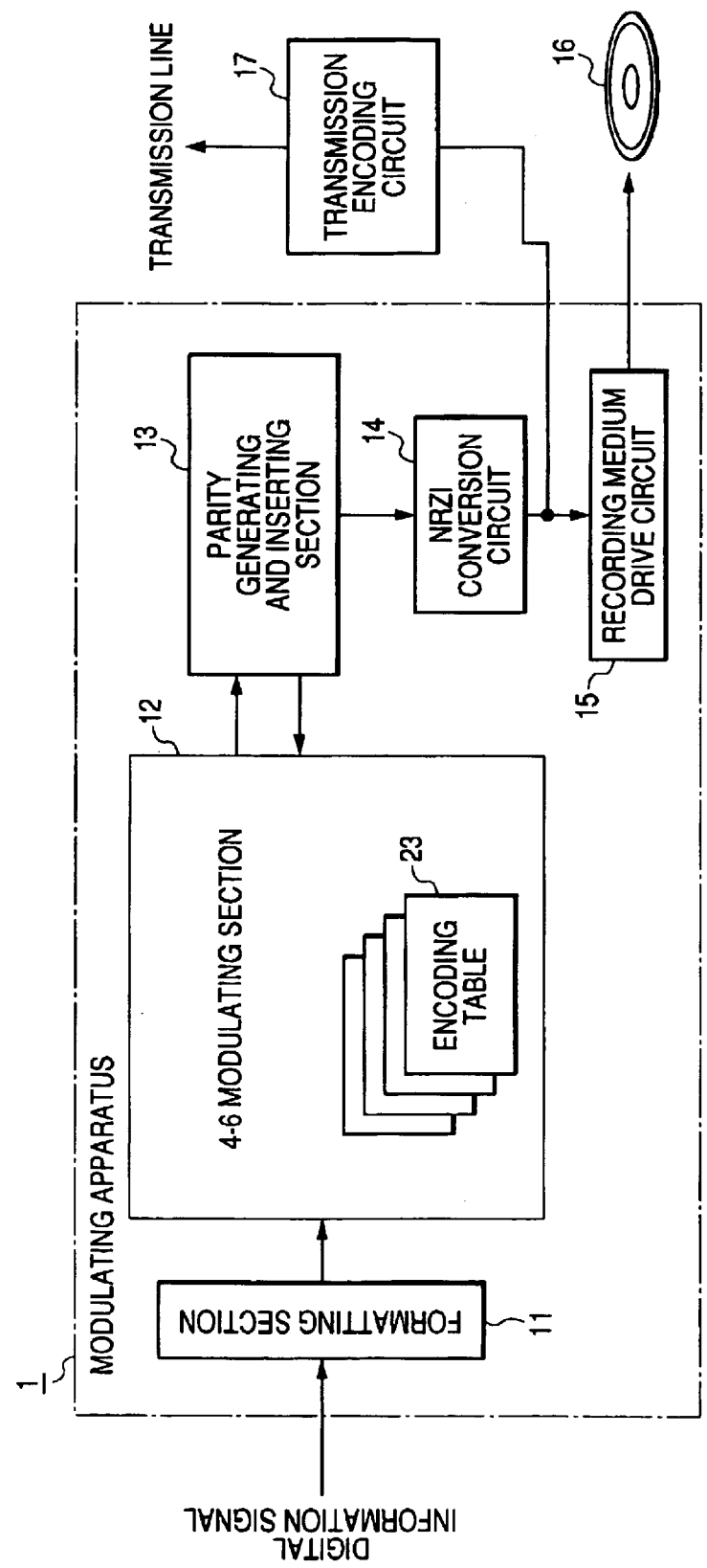
FIG. 1 is a block diagram of an information modulating apparatus according to a first embodiment of this invention.

FIG. 1 shows an information modulating apparatus 1 according to a first embodiment of this invention. The information modulating apparatus 1 is designed as an information recording apparatus. The information modulating apparatus 1 includes a formatting section 11, a 4-6 modulating section 12, a parity generating and inserting section 13, an NRZI (non return to zero inverted) conversion circuit 14, and a recording-medium drive circuit 15 which are sequentially connected in that order. The recording-medium drive circuit 15 can access a recording medium 16 such as an optical disc. The information modulating apparatus 1 basically serves to modulate an input digital signal (an input digital information signal) representative of audio information, video information, or audio-visual information, and to record the modulation-resultant signal on the recording medium 16.

The NRZI conversion circuit 14 may be followed by a transmission encoding circuit 17 connected to a transmission line. The transmission encoding circuit 17 encodes an output signal of the NRZI conversion circuit 17 into a digital signal of a code suited for the transmission through the transmission line. The transmission encoding circuit 17 outputs the resultant transmission-code signal to the transmission line. The transmission-code signal propagates along the transmission line.

It should be noted that the transmission encoding circuit 17 may immediately follow the parity generating and inserting section 13.

The input digital signal is in the form of a first bit stream which is generated as follows. Video information, audio information, or audio-visual information to be recorded or transmitted is converted into the first bit stream by a binarizing device (not shown).

The formatting section 11 receives the input digital signal, that is, the first bit stream. The formatting section 11 formats the first bit stream into a sequence of sync frames. The sync-frame sequence forms a second bit stream. The formatting of the first bit stream into the sync-frame sequence (the second bit stream) includes a step of adding an error correction code, a step of adding frame sync signals, and a step of providing the first bit stream with a sector structure. The formatting section 11 divides the second bit stream into equal-size segments each having a predetermined number "m" of bits. Preferably, the bit number "m" is equal to 4. The bit number "m" may be equal to 4 multiplied by a predetermined natural number. In other words, the bit number "m" may be an integer multiple of 4. The formatting section 11 successively outputs the equal-size segments to the 4-6 modulating section 12 as input data words also called source code words. Preferably, every sync frame corresponds to a prescribed number M of input data words.

The 4-6 modulating section 12 generates a sync word for every sync frame. The sync word is transmitted from the 4-6 modulating section 12 to the NRZI conversion circuit 14 through the parity generating and inserting section 13.

The 4-6 modulating section 12 includes a set of encoding tables 23. The 4-6 modulating section 12 receives a sequence of input data words (source code words) from the formatting section 11, and encodes the input data words into information code words (object code words) by referring to the encoding tables 23. Each of the information code words has a predetermined number "n" of bits. The bit number "n" is greater than the bit number "m". Preferably, the bit number "n" is equal to 6. The bit number "n" may be equal to 6 multiplied by a predetermined natural number. In other words, the bit number "n" may be an integer multiple of 6. The 4-6 modulating section 12 serially connects the information code words to get an information-code-word sequence in the form of a bit stream. The encoding by the 4-6 modulating section 12 is designed so that the information-code-word sequence will obey (1, j) RLL. Here, (1, j) RLL means run length limiting rules such that 1 to j successive bits of "0" should be between bits of "1". Preferably, the number "j" is equal to 7. The number "j" may be equal to 8, 9, or 10. The 4-6 modulating section 12 outputs the information-code-word sequence to the parity generating and inserting section 13.

Each time specified conditions for a word selection which relate to prescribed parameters including the LSB-side zero run length (the LSB-side zero run number) of the latest information code word are satisfied, the 4-6 modulating section 12 generates first and second candidate information code words next to the latest information code word in response to an incoming input data word. The 4-6 modulating section 12 generates and holds first and second information-code-word sequences including the first and second candidate information code words respectively while calculating the DSV's (the digital sum values) of the first and second information-code-word sequences. When the specified conditions for a word selection are satisfied next time, the 4-6 modulating section 12 compares the absolute values of the DSV's and selects one from the first and second information-code-word sequences which corresponds to the smaller of the DSV absolute values. In other words, the 4-6 modulating section 12 selects one from the first and second candidate information code words which corresponds to the smaller of the DSV absolute values. The 4-6 modulating section 12 outputs the selected information-code-word sequence to the parity generating and inserting section 13. In this way, the 4-6 modulating section 12 implements the DSV control of the information-code-word sequence outputted to the parity generating and inserting section 13.

The parity generating and inserting section 13 includes a first memory storing a signal representing a predetermined parity generation matrix H for generating an LDPC (low density parity check) code as a systematic code. The parity generating and inserting section 13 receives the information-code-word sequence in the form of a bit stream from the 4-6 modulating section 12. The parity generating and inserting section 13 includes a second memory for storing or saving the information-code-word sequence on a block-by-block basis, where every block has a prescribed number "N" of successive information code words. One block is smaller than one sync frame in terms of word number. Thus, the prescribed number "N" is smaller than the prescribed number "M" of input data words assigned to one sync frame. The parity generating and inserting section 13 combines every 1-block-corresponding information-code-word bit sequence and an unknown check bit sequence into a column-direction vector. The parity generating and inserting section 13 multiplies the parity generation matrix H and the column-direction vector and sets the multiplication result to "0", thereby generating a system of linear equations in which check bits are unknown variables. The parity generating and inserting section 13 solves the linear equation system, and hence settles the check bits. The parity generating and inserting section 13 changes each settled check bit into a corresponding 3-bit conversion code word in which two bits are "0" and one bit is "1". Specifically, the parity generating and inserting section 13 changes each settled check bit to a 3-bit conversion code word depending on conditions including the logic state of the settled check bit. The parity generating and inserting section 13 inserts the resultant conversion code words among information code words in the present block to get a 1-block-corresponding sequence of output code words. The parity generating and inserting section 13 feeds the output-code-word sequence to the NRZI conversion circuit 14. The output-code-word sequence is in the form of a bit stream. The inserted conversion code words are chosen so that the output-code-word sequence will obey (1, k) RLL. Here, "k" denotes a predetermined natural number. Preferably, the number "k" is equal to 9. The number "k" may be equal to 10, 11, or 12.

The parity generating and inserting section 13 feeds the inserted conversion code words back to the 4-6 modulating section 12. The 4-6 modulating section 12 updates the DSV's in response to the inserted conversion code words at a stage synchronous with the feed of a 1-block-corresponding output-code-word sequence from the parity generating and inserting section 13 to the NRZI conversion circuit 14.

The 4-6 modulating section 12 and the parity generating and inserting section 13 implement the previously-mentioned actions for every block. Thereby, the 4-6 modulating section 12 and the parity generating and inserting section 13 encode or convert input data words into output code words for every block. The output code words are serially connected to form a word sequence in the shape of a bit stream, and the resultant output-code-word sequence is fed from the parity generating and inserting section 13 to the NRZI conversion circuit 14.

The NRZI conversion circuit 14 subjects the incoming output-code-word bit stream inclusive of a periodically-occurring sync word to NRZI modulation to generate modulation-resultant data of an NRZI code. The modulation-resultant data are sent from the NRZI conversion circuit 14 to at least one of the recording-medium drive circuit 15 and the transmission encoding circuit 17. The recording-medium drive circuit 15 records the modulation-resultant data on the recording medium 16, for example, the optical disc. The transmission encoding circuit 17 compresses and encodes the modulation-resultant data into a digital signal of a code suited for the transmission through the transmission line. The transmission encoding circuit 17 outputs the resultant transmission-code signal to the transmission line. The transmission-code signal propagates along the transmission line.

The features of the information modulating apparatus (the information recording apparatus) 1 are as follows. The 4-6 modulating section 12 encodes every 4-bit input data word into a 6-bit information code word. The 4-6 modulating section 12 serially connects the resultant information code words to get an information-code-word sequence in the form of a bit stream which obeys (1, 7) RLL. During the conversion of the input-data-word sequence into the information-code-word sequence, the 4-6 modulating section 12 implements the DSV control including a step of calculating DSV's. For every block having the prescribed number "N" of successive information code words, the parity generating and inserting section 13 settles check bits in response to the parity generation matrix and an information-code-word bit sequence. The parity generating and inserting section 13 changes each settled check bit into a corresponding conversion code. The parity generating and inserting section 13 inserts the resultant conversion code words among information code words to get a sequence of output code words which obeys (1, 9) RLL. For every block, the parity generating and inserting section 13 feeds the inserted conversion code words back to the 4-6 modulating section 12. The 4-6 modulating section 12 updates the DSV's in response to the inserted conversion code words.

Figure 2:
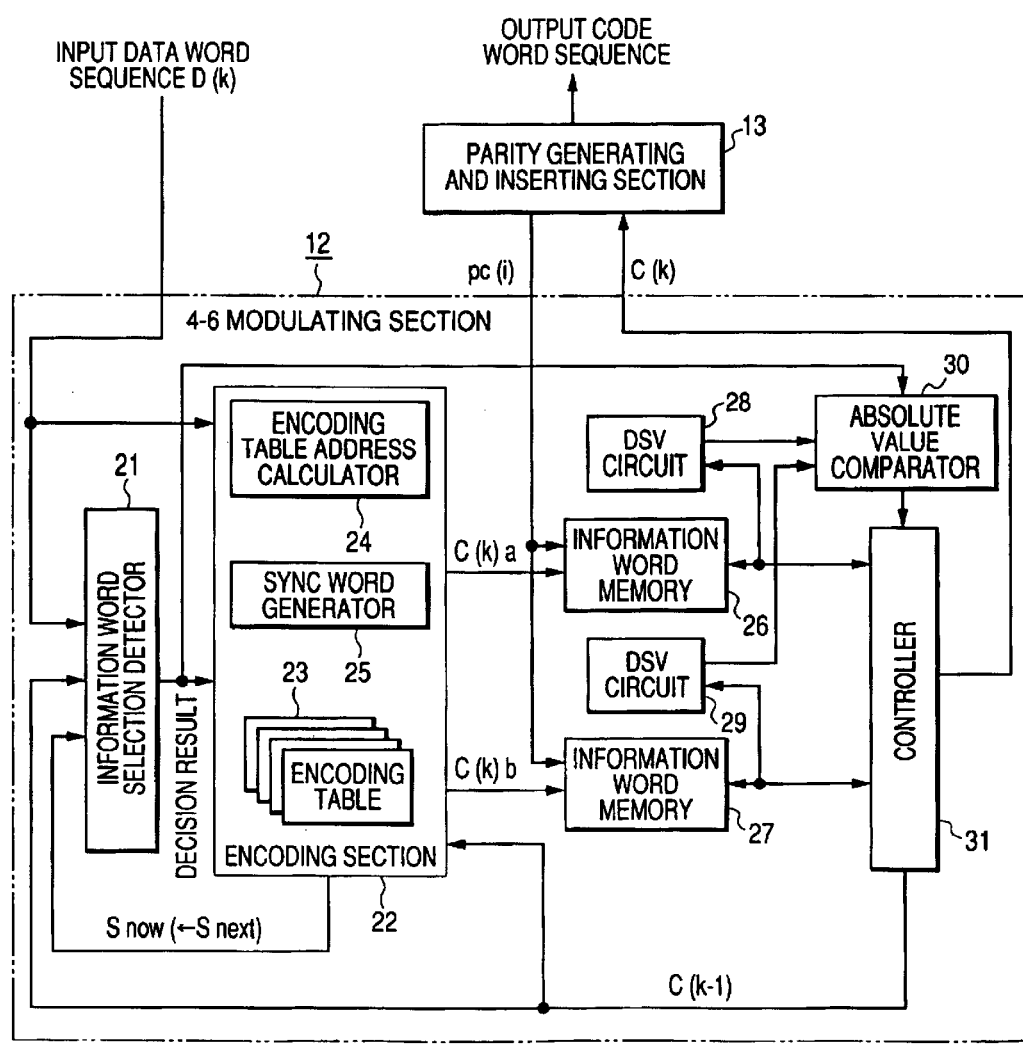
FIG. 2 is a block diagram of a 4-6 modulating section in FIG. 1.

As shown in FIG. 2, the 4-6 modulating section 12 includes an information-word selection detector 21, an encoding section 22, information code word memories (path memories) 26 and 27, DSV circuits 28 and 29, an absolute-value comparator 30, and a controller 31.

The information-word selection detector 21 and the encoding section 22 receive the sequence of input data words (source code words) from the formatting section 11. The information-word selection detector 21 is connected with the encoding section 22, the absolute-value comparator 30, and the controller 31. The encoding section 22 is connected with the path memories 26 and 27, and the controller 31. The path memory 26 is connected with the DSV circuit 28, the controller 31, and the parity generating and inserting section 13. The path memory 27 is connected with the DSV circuit 29, the controller 31, and the parity generating and inserting section 13. The DSV circuits 28 and 29 are connected with the absolute-value comparator 30 and the controller 31. The absolute-value comparator 30 is connected with the controller 31. The controller 31 is connected with the parity generating and inserting section 13.

The encoding section 22 includes the encoding tables 23, an encoding-table address calculator 24, and a sync word generator 25. The encoding section 22 sequentially receives 4-bit input data words (source code words) from the formatting section 11. A current input data word is denoted by D(k). The encoding tables 23 are designed for the conversion of the input data word D(k) into a 6-bit information code word C(k). The encoding-table address calculator 24 computes an address or addresses of a cell or cells in the encoding tables 23 which should be accessed. For every frame, the sync word generator 24 produces a sync word and inserts the sync word into each of information-code-word sequences of paths "a" and "b".

The encoding tables 23 employ 21 different 6-bit information code words having logic states shown in FIG. 3. The encoding tables 23 are four different ones having ID numbers (state numbers Snow) of "0", "1", "2", and "3" respectively.

As shown in FIG. 4, the encoding tables 23 contain arrays of cells each having a set of an input data word D(k), an information code word C(k) assigned to the input data word D(k), and a next-table selection number (a state-information number) Snext accompanying the information code word C(k). In FIG. 4, each input data word D(k) is expressed by the decimal notation while each information code word C(k) is expressed by both the decimal notion and the binary notation. Each next-table selection number Snext designates one of the encoding tables 23 which should be used next as explained hereafter. Specifically, an encoding table 23 having an ID number equal to the next-table selection number Snext is designated. Under normal conditions, when the next-table selection number Snext accompanying the current information code word C(k) is "0", the encoding table 23 having an ID number of "0" is selected and used to generate a next information code word C(k+1) in response to a next input data word D(k+1). When the next-table selection number Snext accompanying the current information code word C(k) is "1", the encoding table 23 having an ID number of "1" is selected and used to generate a next information code word C(k+1) in response to a next input data word D(k+1). When the next-table selection number Snext accompanying the current information code word C(k) is "2", the encoding table 23 having an ID number of "2" is selected and used to generate a next information code word C(k+1) in response to a next input data word D(k+1). When the next-table selection number Snext accompanying the current information code word C(k) is "3", the encoding table 23 having an ID number of "3" is used to generate a next output code word C(k+1) in response to a next input data word D(k+1). A next-table selection number Snext accompanying an information code word C(k−1) immediately preceding the current information code word C(k) is defined as a current-table selection number or a state-information number Snow used for the generation of the current information code word C(k) in response to a current input data word D(k). The 21 different information code words and the next-table selection numbers Snext in the encoding tables 23 are designed so that resultant sequences of information code words will obey (1, 7) RLL.

The encoding table 23 having an ID number of "1" and the encoding table 23 having an ID number of "2" are in a predetermined relation as follows. The NRZI modulation results (the NRZI conversion results) of information code words assigned to prescribed input data words in the encoding table 23 having an ID number of "1" are opposite in polarity ("odd-even" in the number of bits of "1", that is, CDS-related or DSV-related polarity) to those of information code words in the encoding table having an ID number of "2". Here, CDS is short for "code word digital sum". As mentioned later, in the case where the encoding table 23 having an ID number of "2" is originally designated and a current input data word is identical to such a prescribed one, two information code words are read out from the encoding table 23 having an ID number of "2" and the encoding table 23 having an ID number of "1" as two candidate information code words respectively.

The encoding table 23 having an ID number of "1" and the encoding table 23 having an ID number of "3" are in a predetermined relation as follows. The NRZI modulation results of information code words assigned to prescribed input data words in the encoding table 23 having an ID number of "1" are opposite in polarity ("odd-even" in the number of bits of "1", that is, CDS-related or DSV-related polarity) to those of information code words in the encoding table having an ID number of "3". As mentioned later, in the case where the encoding table 23 having an ID number of "3" is originally designated and a current input data word is identical to such a prescribed one, two information code words are read out from the encoding table 23 having an ID number of "3" and the encoding table 23 having an ID number of "1" as two candidate information code words respectively.

The encoding table 23 having an ID number of "0" and the encoding table 23 having an ID number of "2" are in a predetermined relation as follows. The NRZI modulation results of information code words assigned to prescribed input data words in the encoding table 23 having an ID number of "0" are opposite in polarity ("odd-even" in the number of bits of "1", that is, CDS-related or DSV-related polarity) to those of information code words in the encoding table having an ID number of "2". As mentioned later, in the case where the encoding table 23 having an ID number of "2" is originally designated and a current input data word is identical to such a prescribed one, two information code words are read out from the encoding table 23 having an ID number of "2" and the encoding table 23 having an ID number of "0" as two candidate information code words respectively.

The encoding section 22 reads out an information code word C(k)a for the path "a" and an information code word C(k)b for the path "b" from the encoding tables 23 in response to a current input data word D(k). For the read-out, the encoding-table address calculator 24 computes the address or addresses of a target cell or cells in the encoding tables 23 from parameters including the logic state of the input data word D(k). The target cell or cells are accessed in response to the computed address or addresses, and the information code words C(k)a and C(k)b are read out therefrom. The information-word selection detector 21 sequentially receives input data words (source code words) from the formatting section 11. The information-word selection detector 21 decides whether or not an information-code-word selection should be performed for a current input data word D(k), that is, whether an information-code-word selection is present or absent regarding a current input data D(k). The information-word selection detector 21 notifies the result of the decision to the encoding section 22. When the decision result indicates the absence of a word selection, the encoding section 22 accesses only the encoding table 23 designated by the current-table selection number Snow and reads out an information code word C(k) therefrom in response to the input data word D(k). The read-out information code word C(k) is used as the information code words C(k)a and C(k)b. On the other hand, when the decision result indicates the presence of a word selection, the encoding section 22 accesses not only the encoding table 23 designated by the current-table selection number Snow but also another of the encoding tables 23 and reads out information code words C(k) therefrom in response to the input data word D(k). The read-out information code words C(k) are used as the information code words C(k)a and C(k)b, respectively.

Provided that the sum of the LSB-side zero run length of an information code word C(k) and the MSB-side zero run length of the next information code word C(k+1) is equal to 7 or less, (1, 7) RLL is kept. With reference to FIG. 5, in order to keep (1, 7) RLL, only information code words having specified MSB-side zero run lengths depending on the LSB-side zero run length of the current information code word C(k) can be used as the next information code word C(k+1). In FIG. 5, "x" denotes a bit of "0" or "1".

The encoding tables 23 employ the information code words listed in FIG. 5. The assignment of information code words C(k) to input data words D(k) in the encoding tables 23, and the assignment of next-table selection numbers Snext to information code words C(k) in the encoding tables 23 are designed so that sequences of information code words of paths "a" and "b" will obey (1, 7) RLL.

As shown in FIG. 4, every information code word C(k) in each of the encoding tables 23 is assigned in common to different input data words D(k). For example, in the encoding table 23 having an ID number of "0", an information code word "000001" is assigned to input data words D(k) of "0" and "1", and an information code word "010001" is assigned to input data words D(k) of "2" and "3". An information code word "010010" is assigned to input data words D(k) of "4", "5", and "6". An information code word "010101" is assigned to input data words D(k) of "7" and "8". An information code word "010100" is assigned to input data words D(k) of "9", "10", and "11". An information code word "000000" is assigned to input data words D(k) of "12" and "13". An information code word "010000" is assigned to input data words D(k) of "14" and "15".

As shown in FIG. 4, equal information code words C(k) assigned to different input data words D(k) are accompanied with different next-table selection numbers Snext, respectively. In other words, different next-table selection numbers Snext are given to respective input data words D(k) to which a same information code word C(k) is assigned in common. Thus, an information code word C(k+1) for the next input data word D(k+1) is read out from an encoding table 23 selected depending on the current input data word D(k). The encoding tables 23 having ID numbers of "0", "1", "2", and "3" differ from each other in contents. A modulation side analyzes a sequence of information code words in consideration of the foregoing design of the encoding tables 23, and decodes a current information code word C(k) into a unique data word D(k).

As previously explained, the 4-6 modulating section 12 and the parity generating and inserting section 13 cooperate to encode an input-data-word sequence into an output-code-word sequence obeying (1, 9) RLL and undergoing the DSV control. The operation of the 4-6 modulating section 12 and the parity generating and inserting section 13 will be further explained below.

At an initial stage, the encoding section 22 sets a current-table selection number Snow to a predetermined initial value while the DSV circuits 28 and 29 set an NRZI-related DSV's of the paths "a" and "b" to a predetermined initial value. The DSV circuit 28 includes a memory for storing a signal representing the DSV of the path "a". The DSV circuit 29 includes a memory for storing a signal representing the DSV of the path "b".

When a first input data word D(1) comes to the encoding section 22 from the formatting section 11, the sync word generator 24 produces a sync word and writes the sync word into the information code word memories 26 and 27. The DSV circuit 28 accesses the path memory 26, and calculates the CDS of the sync word. The DSV circuit 28 updates the DSV of the path "a" in accordance with the calculated CDS. The DSV circuit 29 accesses the path memory 27, and calculates the CDS of the sync word. The DSV circuit 29 updates the DSV of the path "b" in accordance with the calculated CDS. The controller 31 transmits the sync word from the information code word memory 26 or 27 to the parity generating and inserting section 13. The parity generating and inserting section 13 passes the sync word to the NRZI conversion circuit 14. Thus, the sync word is sent from the encoding section 22 to the NRZI conversion circuit 14 on a "through" basis.

The encoding section 22 selects one from the encoding tables 23 which is designated by the current-table selection number Snow. In response to the first input data word D(1), the encoding section 22 accesses one of cells in the selected encoding table 23 and reads out an information code word and a next-table selection number Snext from the accessed cell. Thus, the encoding section 22 reads out an information code word and a related next-table selection number Snext from the encoding tables 23 which corresponds to the first input data word D(1). The encoding section 22 updates the current-table selection number Snow to the read-out next-table selection number Snext. The encoding section 22 informs the information-word selection detector 21 of the current-table selection number Snow. The encoding section 22 outputs the read-out information code word to the path memory 26 as an information code word C(1)a of the path "a". The encoding section 22 outputs the read-out information code word to the path memory 27 as an information code word C(1)b of the path "b". The path memories 26 and 27 save the information code words C(1)a and C(1)b, respectively.

The DSV circuit 28 calculates the CDS of the information code word C(1)a in the path memory 26, and updates the DSV of the path "a" in accordance with the calculated CDS. Similarly, the DSV circuit 29 calculates the CDS of the information code word C(1)b in the path memory 27, and updates the DSV of the path "b" in accordance with the calculated CDS.

Input data words D(k) (k=2, 3, 4, . . . ) following the first one D(1) successively come to the information-word selection detector 21 and the encoding section 22 from the formatting section 11. At the moment of the arrival of every input data word D(k), information code words C(k−1)a and C(k−1)b corresponding to the immediately-preceding input data word D(k−1) are saved in the path memories 26 and 27 respectively. In addition, the DSV which has been calculated for the path-"a" information-code-word sequence up to the latest information code word C(k−1)a is saved in the DSV circuit 28. Also, the DSV which has been calculated for the path-"b" information-code-word sequence up to the information code word C(k−1)b is saved in the DSV circuit 29.

The information-word selection detector 21 receives a signal representative of the current-table selection number Snow from the encoding section 22. In addition, the information-word selection detector 21 is notified by the controller 31 of the latest information code word C(k−1), that is, an information code word for the immediately-preceding input data word D(k−1). Furthermore, the information-word selection detector 21 accesses the encoding section 22 to get an information code word C(k+1) for an input data word D(k+1) next to the current input data word D(k). The information-word selection detector 21 decides whether or not the current input data word D(k), the current-table selection number Snow, the latest information code word C(k−1), and the MSB of the later information code word C(k+1) satisfy predetermined conditions for the execution of the DSV control, that is, predetermined conditions for a word selection. The information-word selection detector 21 notifies the encoding section 22 and the absolute-value comparator 30 of the decision result. When the predetermined conditions are satisfied, the decision result indicates the presence of a word selection. Otherwise, the decision result indicates the absence of a word selection.

Each time the latest information code word C(k−1)a has been written into the path memory 26, the DSV circuit 28 updates the DSV of the path "a" in response to the written information code word C(k−1)a. Normally, in the path memory 26, there is a succession of information code words in which the newest one is the latest information code word C(k−1)a while the previous ones include the candidate information code word corresponding to the last word selection. The updated DSV of the path "a" relates to the succession of information code words in the path memory 26. The DSV circuit 28 notifies the absolute-value comparator 30 of the updated DSV of the path "a". Normally, the controller 31 transmits the latest information code word C(k−1)a from the path memory 26 to the information-word selection detector 21 as one denoted by C(k−1).

Each time the latest information code word C(k−1)b has been written into the path memory 27, the DSV circuit 29 updates the DSV of the path "b" in response to the written information code word C(k−1)b. Normally, in the path memory 27, there is a succession of information code words in which the newest one is the latest information code word C(k−1)b while the previous ones include the candidate information code word corresponding to the last code-word selection. The updated DSV of the path "b" relates to the succession of information code words in the path memory 27. The DSV circuit 29 notifies the absolute-value comparator 30 of the updated DSV of the path "b".

The absolute-value comparator 30 responds to the decision result fed from the information-word selection detector 21. When the decision result indicates the presence of a word selection, the absolute-value comparator 30 calculates the absolute values of the DSV's of the paths "a" and "b" and compares the absolute values to decide which of the two is smaller. The absolute-value comparator 30 notifies the controller 31 of the comparison result.

When the comparison result indicates that the absolute value of the path-"a" DSV is equal to or smaller than that of the path-"b" DSV, the controller 31 reads out successive information code words from the path memory 26 and transfers them to the parity generating and inserting section 13 as finally-selected information code words. The oldest one among the transferred information code words is the candidate one corresponding to the last word selection. When the comparison result indicates that the absolute value of the path-"a" DSV is greater than that of the path-"b" DSV, the controller 31 reads out successive information code words from the path memory 27 and transfers them to the parity generating and inserting section 13 as finally-selected information code words. The oldest one among the transferred information code words is the candidate one corresponding to the last word selection.

In the case where the absolute value of the path-"a" DSV is equal to or smaller than that of the path-"b" DSV, the controller 31 orders the DSV circuits 28 and 29 to update the DSV of the path "b" to the DSV of the path "a". At the same time, the controller 31 orders the path memories 26 and 27 to update the contents (the stored information code words) of the path memory 27 to those of the path memory 26. On the other hand, in the case where the absolute value of the path-"a" DSV is greater than that of the path-"b" DSV, the controller 31 orders the DSV circuits 28 and 29 to update the DSV of the path "a" to the DSV of the path "b". At the same time, the controller 31 orders the path memories 26 and 27 to update the contents (the stored information code words) of the path memory 26 to those of the path memory 27.

The operation of the information-word selection detector 21 will be further explained below. The information-word selection detector 21 checks the LSB-side zero run length (the LSB-side zero run number) of the latest information code word C(k−1). The information-word selection detector 21 chooses one from operation procedures (1), (2), (3), and (4) basically in response to the LSB-side zero run length of the latest information code word C(k−1). The operation procedures (1), (2), (3), and (4) are as follows.

(1) In the case where the LSB-side zero run length of the latest information code word C(k−1) is equal to "0", "3", or "6", the information-word selection detector 21 decides that a word selection should be absent. The information-word selection detector 21 notifies the encoding section 22 and the absolute-value comparator 30 of the decision result. In this case, only the encoding table 23 designated by the current-table selection number Snow will be used for determining information code words C(k)a and C(k)b corresponding to the current input data word D(k). The information code words C(k)a and C(k)b are the same.

(2) In the case where the LSB-side zero run length of the latest information code word C(k−1) is equal to "4", the information-word selection detector 21 checks the current-table selection number Snow and the current input data word D(k).

When the current-table selection number Snow is "3" and the current input data word D(k) is between "0" and "3" (decimal), the information-word selection detector 21 decides that a word selection should be present. The information-word selection detector 21 notifies the encoding section 22 and the absolute-value comparator 30 of the decision result. In addition, the information-word selection detector 21 notifies the encoding section 22 of another current-table selection number Snow being "1". Thus, the encoding tables 23 designated by current-table selection numbers Snow of "3" and "1" will be used for determining information code words C(k)a and C(k)b corresponding to the current input data word D(k) respectively. The information code words C(k)a and C(k)b are different.

When the current-table selection number Snow is "2" and the current input data word D(k) is between "7" and "15" (decimal), the information-word selection detector 21 decides that a word selection should be present. The information-word selection detector 21 notifies the encoding section 22 and the absolute-value comparator 30 of the decision result. In addition, the information-word selection detector 21 notifies the encoding section 22 of another current-table selection number Snow being "1". Thus, the encoding tables 23 designated by current-table selection numbers Snow of "2" and "1" will be used for determining information code words C(k)a and C(k)b corresponding to the current input data word D(k) respectively. The information code words C(k)a and C(k)b are different.

When the foregoing conditions are not satisfied, the information-word selection detector 21 decides that a word selection should be absent. The information-word selection detector 21 notifies the encoding section 22 and the absolute-value comparator 30 of the decision result.

(3) In the case where the LSB-side zero run length of the latest information code word C(k−1) is equal to "5", the information-word selection detector 21 checks the current-table selection number Snow and the current input data word D(k).

When the current-table selection number Snow is "3" and the current input data word D(k) is "0" or "1" (decimal), the information-word selection detector 21 decides that a word selection should be present. The information-word selection detector 21 notifies the encoding section 22 and the absolute-value comparator 30 of the decision result. In addition, the information-word selection detector 21 notifies the encoding section 22 of another current-table selection number Snow being "1". Thus, the encoding tables 23 designated by current-table selection numbers Snow of "3" and "1" will be used for determining information code words C(k)a and C(k)b corresponding to the current input data word D(k) respectively. The information code words C(k)a and C(k)b are different.

When the current-table selection number Snow is "2" and the current input data word D(k) is between "10" and "15" (decimal), the information-word selection detector 21 decides that a word selection should be present. The information-word selection detector 21 notifies the encoding section 22 and the absolute-value comparator 30 of the decision result. In addition, the information-word selection detector 21 notifies the encoding section 22 of another current-table selection number Snow being "1". Thus, the encoding tables 23 designated by current-table selection numbers Snow of "2" and "1" will be used for determining information code words C(k)a and C(k)b corresponding to the current input data word D(k) respectively. The information code words C(k)a and C(k)b are different.

When the foregoing conditions are not satisfied, the information-word selection detector 21 decides that a word selection should be absent. The information-word selection detector 21 notifies the encoding section 22 and the absolute-value comparator 30 of the decision result.

(4) In the case where the LSB-side zero run length of the latest information code word C(k−1) is equal to "1" or "2", the information-word selection detector 21 checks the current-table selection number Snow and the current input data word D(k). Furthermore, the information-word selection detector 21 accesses the encoding section 22 to get information about a next information code word C(k+1) corresponding to the next input data word D(k+1).

When the current-table selection number Snow is "2" and the current input data word D(k) is "0" or "1" (decimal), the information-word selection detector 21 decides that a word selection should be present. The information-word selection detector 21 notifies the encoding section 22 and the absolute-value comparator 30 of the decision result. In addition, the information-word selection detector 21 notifies the encoding section 22 of another current-table selection number Snow being "0". Thus, the encoding tables 23 designated by current-table selection numbers Snow of "2"

and "0" will be used for determining information code words C(k)a and C(k)b corresponding to the current input data word D(k) respectively. The information code words C(k)a and C(k)b are different.

When the LSB-side zero run length of the latest information code word C(k−1) is equal to "1" and the current-table selection number Snow is "2" and the current input data word D(k) is "12" or "13" (decimal), the information-word selection detector 21 checks the MSB of a next information code word C(k+1) corresponding to the next input data word D(k+1). When the MSB of the next information code word C(k+1) is "1", the information-word selection detector 21 decides that a word selection should be present. The information-word selection detector 21 notifies the encoding section 22 and the absolute-value comparator 30 of the decision result. In addition, the information-word selection detector 21 notifies the encoding section 22 of another current-table selection number Snow being "0". Thus, the encoding tables 23 designated by current-table selection numbers Snow of "2" and "0" will be used for determining information code words C(k)a and C(k)b corresponding to the current input data word D(k) respectively. The information code words C(k)a and C(k)b are different.

When the foregoing conditions are not satisfied, the information-word selection detector 21 decides that a word selection should be absent. The information-word selection detector 21 notifies the encoding section 22 and the absolute-value comparator 30 of the decision result.

One is selected from these operation procedures (1), (2), (3), and (4), and the selected operation procedure is executed by the information-word selection detector 21.

In the case where the LSB-side zero run length of the latest information code word C(k−1) is equal to none of "0", "1", "2", "3", "4", "5", and "6", the information-word selection detector 21 concludes that an error occurs. Also, in the case where the LSB-side zero run length of the latest information code word C(k−1) is equal to "2", the information-word selection detector 21 concludes that an error occurs when the following conditions are not satisfied. The current-table selection number Snow is "2", and the current input data word D(k) is "0" or "1" (decimal).

Preferably, the information-word selection detector 21 is designed so that word selections will be inhibited from occurring for two successive input data words.

As previously mentioned, the encoding section 22 uses the next-table selection number Snext as a current-table selection number Snow for a new input data word. This current-table selection number is referred to as the original current-table selection number Snowa. As previously mentioned, when the decision result fed from the information-word selection detector 21 to the encoding section 22 indicates the presence of a word selection, the information-word selection detector 21 notifies the encoding section 22 of additional current-table selection number different from the original one. The additional current-table selection number is denoted by Snowb.

The encoding-table address calculator 24 in the encoding section 22 computes an address from the current input data word D(k). When the decision result fed from the information-word selection detector 21 indicates the presence of a word selection, the encoding table 23 designated by the original current-table selection number Snowa is accessed in response to the computed address to read out an information code word C(k)a assigned to the current input data word D(k). Similarly, the encoding table 23 designated by the additional current-table selection number Snowb is accessed in response to the computed address to read out an information code word C(k)b assigned to the current input data word D(k). The encoding section 22 writes the information code word C(k)a and C(k)b into the path memories 26 and 27 as candidate information code words, respectively. In this case, the information code word C(k)a and C(k)b are different.

When the decision result fed from the information-word selection detector 21 indicates the absence of a word selection, the encoding table 23 designated by the original current-table selection number Snowa is accessed in response to the computed address to read out an information code word C(k) assigned to the current input data word D(k). The encoding section 22 writes the information code word C(k) into the path memories 26 and 27 as information code words C(k)a and C(k)b, respectively. In this case, the information code words C(k)a and C(k)b are the same.

The DSV circuit 28 calculates a CDS (code word digital sum) of the latest information code word C(k)a in the path memory 26, and updates the path-"a" DSV of the latest information code word C(k)a and previous information code words in response to the calculated CDS. Similarly, the DSV circuit 29 calculates a CDS of the latest information code word C(k)b in the path memory 27, and updates the path-"b" DSV of the latest information code word C(k)b and previous information code words in response to the calculated CDS.

The above-mentioned operation sequence is reiterated. During the reiterative execution of the above-mentioned operation sequence, the DSV control is implemented each time the information-word selection detector 21 decides that a word selection should be present. Specifically, when the decision result fed from the information-word selection detector 21 indicates the presence of a word selection, the absolute-value comparator 30 accesses the DSV circuits 28 and 29 to get information about the DSV's of the paths "a" and "b". The absolute-value comparator 30 calculates the absolute values of the DSV's of the paths "a" and "b" and compares the absolute values to decide which of the two is smaller. The absolute-value comparator 30 notifies the controller 31 of the comparison result. When the comparison result indicates that the absolute value of the path-"a" DSV is equal to or smaller than that of the path-"b" DSV, the controller 31 reads out successive information code words from the path memory 26 and transfers them to the parity generating and inserting section 13 as finally-selected information code words. The oldest one among the transferred information code words is the candidate one corresponding to the last word selection. When the comparison result indicates that the absolute value of the path-"a" DSV is greater than that of the path-"b" DSV, the controller 31 reads out successive information code words from the path memory 27 and transfers them to the parity generating and inserting section 13 as finally-selected information code words. The oldest one among the transferred information code words is the candidate one corresponding to the last word selection.

Figure 7:
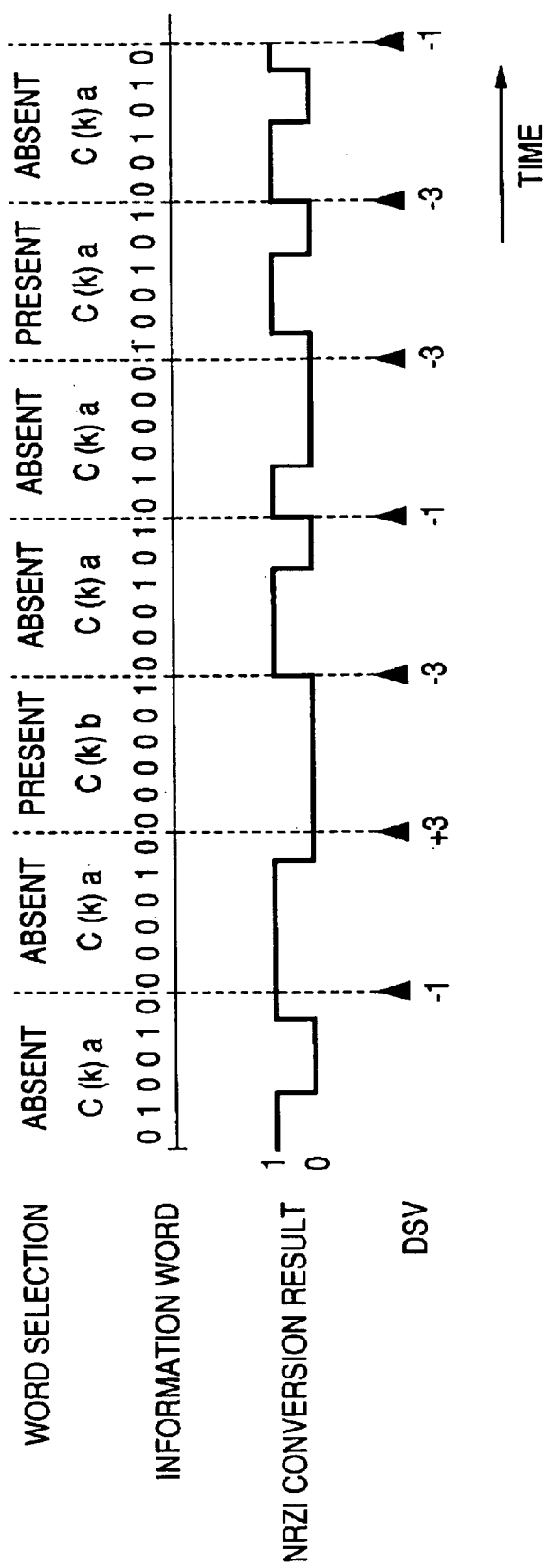
FIG. 7 is a time-domain diagram of a bit stream representing successive information code words, the NRZI conversion result of the bit stream, and the DSV of the bit stream which occur under the conditions in FIG. 6.

With reference to FIGS. 6 and 7, the DSV control will be further explained while a sequence of input data words of "4", "5", "1", "2", "15", "3", "11", . . . (decimal) is taken as an example. It is assumed that the current-table selection number Snow (Snowa) is "0" for the first input data word being "4".

A word selection is decided to be absent regarding the first input data word being "4". Therefore, an information code word of "18" (decimal), that is, an information code word of 010010, assigned to the first input data word is read out from the encoding table 23 having an ID number of "0" equal to the current-table selection number Snow (Snowa). The read-out information code word is outputted to the path memories 26 and 27 as information code words C(k)a and C(k)b respectively. A next-table selection number Snext of "1" which accompanies the read-out information code word will be used as the current-table selection number Snow (Snowa) for the second input data word being "5".

A word selection is decided to be absent regarding the second input data word being "5". Therefore, an information code word of "2" (decimal), that is, an information code word of 000010, assigned to the second input data word is read out from the encoding table 23 having an ID number of "1" equal to the current-table selection number Snow (Snowa). The read-out information code word is outputted to the path memories 26 and 27 as information code words C(k)a and C(k)b respectively. A next-table selection number Snext of "2" which accompanies the read-out information code word will be used as the current-table selection number Snow (Snowa) for the third input data word being "1".

A word selection is decided to be present regarding the third input data word being "1". Furthermore, it is decided that the additional current-table selection number Snowb is "0". An information code word of "33" (decimal), that is, an information code word of 100001, assigned to the third input data word is read out from the encoding table 23 having an ID number of "2" equal to the current-table selection number Snowa. The read-out information code word is outputted to the path memory 26 as an information code word C(k)a. A next-table selection number Snext of "1" which accompanies the read-out information code word will be used as the current-table selection number Snow (Snowa) for the fourth input data word being "2". Similarly, an information code word of "1" (decimal), that is, an information code word of 000001, assigned to the third input data word is read out from the encoding table 23 having an ID number of "0" equal to the current-table selection number Snowb. The read-out information code word is outputted to the path memory 27 as an information code word C(k)b. The information code words C(k)a and C(k)b are candidate ones different from each other. Upon the next occurrence of a word selection, one will be selected from the candidate information code words C(k)a and C(k)b.

A word selection is decided to be absent regarding the fourth input data word being "2". Therefore, an information code word of "5" (decimal), that is, an information code word of 000101, assigned to the fourth input data word is read out from the encoding table 23 having an ID number of "1" equal to the current-table selection number Snow (Snowa). The read-out information code word is outputted to the path memories 26 and 27 as information code words C(k)a and C(k)b respectively. A next-table selection number Snext of "0" which accompanies the read-out information code word will be used as the current-table selection number Snow (Snowa) for the fifth input data word being "15".

A word selection is decided to be absent regarding the fifth input data word being "15". Therefore, an information code word of "16" (decimal), that is, an information code word of 010000, assigned to the fifth input data word is read out from the encoding table 23 having an ID number of "0" equal to the current-table selection number Snow (Snowa). The read-out information code word is outputted to the path memories 26 and 27 as information code words C(k)a and C(k)b respectively. A next-table selection number Snext of "3" which accompanies the read-out information code word will be used as the current-table selection number Snow (Snowa) for the sixth input data word being "3".

A word selection is decided to be present regarding the sixth input data word being "3". The DSV of the path "a" and that of the path "b" are calculated for the information code words up to one corresponding to the fifth input data word. For example, the calculated DSV of the path "a" is equal to "+7" while that of the path "b" is equal to "−3". The absolute values of the calculated DSV's of the paths "a" and "b" are compared. One is selected from the information-code-word sequence in the path memory 26 and the information-code-word sequence in the path memory 27 in accordance with the comparison result. Specifically, the information-code-word sequence corresponding to the smaller DSV absolute value is selected. For example, the information-code-word sequence in the path memory 27 is selected since the absolute value of the path-"a" DSV is equal to "7" while that of the path-"b" DSV is equal to "3". The selected information-code-word sequence is outputted to the parity generating and inserting section 13. Thus, one is selected from the candidate information code words in the memories 26 and 27 which correspond to the third input data word. For example, the candidate information code word being 000001 (which is in the path memory 27) is selected as one corresponding to the third input data word. It is decided that the additional current-table selection number Snowb is "1". An information code word of "37" (decimal), that is, an information code word of 100101, assigned to the sixth input data word is read out from the encoding table 23 having an ID number of "3" equal to the current-table selection number Snowa. The read-out information code word is outputted to the path memory 26 as an information code word C(k)a. A next-table selection number Snext of "1" which accompanies the read-out information code word will be used as the current-table selection number Snow (Snowa) for the seventh input data word being "11". Similarly, an information code word of "5" (decimal), that is, an information code word of 000101, assigned to the sixth input data word is read out from the encoding table 23 having an ID number of "1" equal to the current-table selection number Snowb. The read-out information code word is outputted to the path memory 27 as an information code word C(k)b.

A word selection is decided to be absent regarding the seventh input data word being "11". Therefore, an information code word of "10" (decimal), that is, an information code word of 001010, assigned to the seventh input data word is read out from the encoding table 23 having an ID number of "1" equal to the current-table selection number Snow (Snowa). The read-out information code word is outputted to the path memories 26 and 27 as information code words C(k)a and C(k)b respectively. A next-table selection number Snext of "2" which accompanies the read-out information code word will be used as the current-table selection number Snow (Snowa) for the eighth input data word.

Thus, the information-code-word sequence outputted to the parity generating and inserting section 13 forms a bit stream as shown in FIG. 7. The NRZI-conversion-resultant signal for the bit stream changes between a state of "1" and a state of "0" as shown in FIG. 7. The DSV relating to the information-code-word sequence varies as shown in FIG. 7. The bit stream in FIG. 7 obeys (1, 7) RLL. In addition, the bit stream has only a small amount of the DC component since an increase in the DSV is suppressed as a result of the DSV control.

The parity generating and inserting section 13 receives a sequence of information code words from the controller 31 in the 4-6 modulating section 12. The parity generating and inserting section 13 processes the received informationcode-word sequence on a block-by-block basis, wherein every block has the prescribed number "N" of successive information code words. Preferably, the prescribed number N is equal to "312". The memory in the parity generating and inserting section 13 stores or saves every 1-block-corresponding set of successive information code words. The other memory therein stores the signal representing the predetermined parity generation matrix H for generating an LDPC code as a systematic code.

Figure 8:
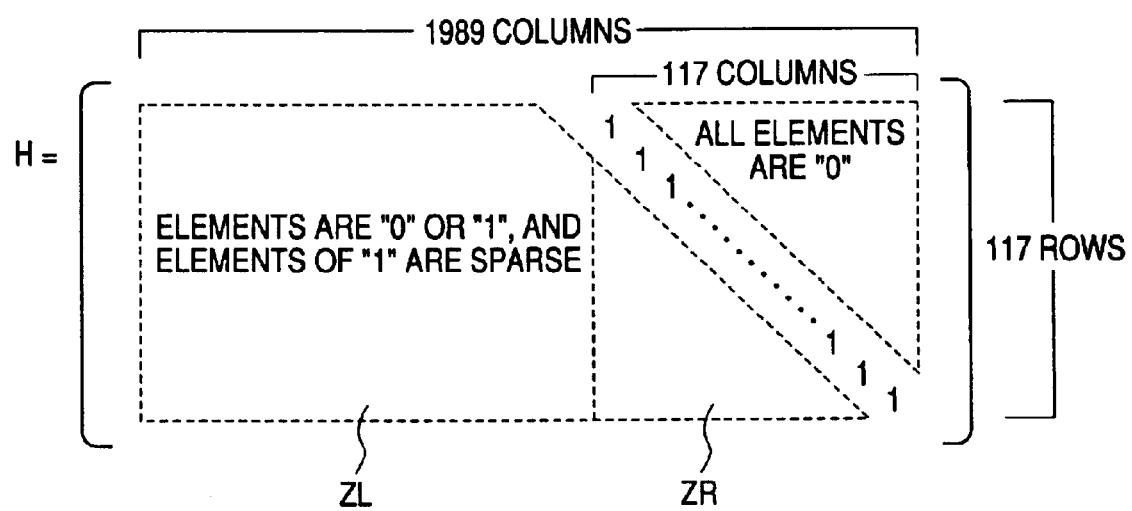
FIG. 8 is a diagram of a parity generation matrix used by a parity generating and inserting section in FIGS. 1 and 2.

As shown in FIG. 8, the parity generation matrix H is composed of 117 rows by 1989 columns. Every 1-block-corresponding set of successive information code words is composed of 1872 (=6 by 312) bits. The parity generation matrix H is designed to generate 117 check bits for every 1-block-corresponding set of successive information code words. The parity generation matrix H is predetermined in a conventional way.

The parity generation matrix H is divided into a left-hand rectangular zone ZL of 117 rows by 1872 columns and a right-hand square zone ZR of 117 rows by 117 columns. All the main diagonal elements in the square zone ZR are "1". All the elements in the upper-right triangular part of the square zone ZR which extends above the main diagonal are "0". The rectangular zone ZL and the lower-left triangular part of the square zone ZR which extends below the main diagonal are filled with elements of "0" and elements of "1", where elements of "1" are sparse.

When an end information code word in every block is inputted into the parity generating and inserting section 13, a compete 1-block-corresponding set of successive information code words C(1), C(2), . . . , C(312) is saved therein. Successive bits composing the 1-block-corresponding set of successive information code words are denoted by u(1), u(2), . . . , and u(1872), respectively. Unknown check bits are denoted by p(1), p(2), . . . , and p(117), respectively. The information-code-word bits u(1), u(2), . . . , and u(1872), and the check bits p(1), p(2), . . . , and p(117) are sequentially placed in a column-direction information vector. Thus, the information vector is expressed as [u(1), u(2), . . . , u(1872), p(1), p(2), . . . , p(117)], where the check bits p(1), p(2), . . . , and p(117) are unknown variables.

The parity generating and inserting section 13 multiplies the parity generation matrix H and the information vector and sets the multiplication result to "0" according to the following equation.

$$\left[ H \right] \left[ \begin{array}{c} u(1) \\ u(2) \\ \vdots \\ u(1872) \\ p(1) \\ p(2) \\ \vdots \\ p(117) \end{array} \right] = 0$$

As a result, a system of 117 linear equations is obtained in which the check bits p(1), p(2), . . . , and p(117) are unknown variables. The parity generating and inserting section 13 solves the linear equation system, and hence settles the check bits p(1), p(2), . . . , and p(117).

The parity generating and inserting section 13 changes each settled check bit p(i) into a corresponding 3-bit conversion code word pc(i) in which two bits are "0" and one bit is "1". Here, "i"=1, 2, . . . , 117. Specifically, the parity generating and inserting section 13 changes each settled check bit p(i) to a 3-bit conversion code word pc(i) depending on conditions including the logic state of the settled check bit p(i). The parity generating and inserting section 13 inserts the resultant conversion code words pc(1), pc(2), . . . , and pc(117) among information code words C(1), C(2), . . . , and C(312) in the present block to get a 1-block-corresponding sequence of output code words. In more detail, the parity generating and inserting section 13 inserts each conversion code word p(i) between information code words C(i) and C(i+1).

A way of changing each check bit p(i) to a 3-bit conversion code word pc(i) is as follows. A decision is made as to whether the LSB of the information code word C(k) is "0" or "1". When the LSB of the information code word C(k) is "0" and the check pit p(i) is "0", the check bit p(i) is changed to a conversion code word pc(i) of "100". When the LSB of the information code word C(k) is "0" and the check pit p(i) is "1", the check bit p(i) is changed to a conversion code word pc(i) of "010". When the LSB of the information code word C(k) is "1" and the check pit p(i) is "0", the check bit p(i) is changed to a conversion code word pc(i) of "001". When the LSB of the information code word C(k) is "1" and the check pit p(i) is "1", the check bit p(i) is changed to a conversion code word pc(i) of "010".

The 3-bit conversion code words pc(1), pc(2), . . . , and pc(117), and the assignment of the check bits p(1), p(2), . . . , and p(117) thereto are designed so that a set of an information code word C(i), each 3-bit conversion code word pc(i), and an information code word C(i+1) will not cause a succession of bits of "1" and will obey (1, 9) RLL. Each check bit p(i) is equal in logic state to the center bit in the corresponding 3-bit conversion code word pc(i). This relation makes it easy to decode each conversion code word pc(i) into the original check bit p(i).

For every block, the parity generating and inserting section 13 combines information code words C(1), C(2), . . . , and C(312) and conversion code words pc(1), pc(2), . . . , and pc(117) into a sequence of output code words expressed as "C(1), pc(1), C(2), pc(2), . . . , C(117), pc(117), C(118), C(119), . . . , C(312)". Thus, the conversion code words pc(1), pc(2), . . . , and pc(117) are added to the ends of the information code words C(1), C(2), . . . , and C(117), respectively. The conversion code word pc(117) is followed by a succession of the information code words C(118), C(119), . . . , and C(312). The parity generating and inserting section 13 feeds the output-code-word sequence to the NRZI conversion circuit 14.

For every block, the parity generating and inserting section 13 feeds conversion code words pc(1), pc(2), . . . , and pc(117) back to the path memories 26 and 27 in the 4-6 modulating section 12. The conversion code words pc(1), pc(2), . . . , and pc(117) are stored in the path memories 26 and 27. The DSV circuit 28 accesses the path memory 26, and calculates CDS's of the conversion code words pc(1), pc(2), . . . , and pc(117). The DSV circuit 28 updates the DSV of the path "a" in response to the calculated CDS's. The DSV circuit 29 accesses the path memory 27, and calculates CDS's of the conversion code words pc(1), pc(2), . . . , and pc(117). The DSV circuit 29 updates the DSV of the path "b" in response to the calculated CDS's. The updated DSV's of the paths "a" and "b" are sufficiently accurate for the reasons as follows. The check bits p(1), p(2), . . . , and p(117) take "1" and "0" at random. Thus, the center bits in the conversion code words pc(1), pc(2), . . . , and pc(117) take "1" and "0" at random also. Each of the conversion code words pc(1), pc(2), . . . , and pc(117) is "100", "001", or "010". Such a 3-bit pattern causes an inversion bit of "1" in every 3 successive NRZI-conversion-resultant bits, and hence may cause only a DSV error of ±1.

The DSV's of the paths "a" and "b" may be exactly updated in the following way. In the path memory 26, the conversion code words pc(1), pc(2), ..., and pc(117) fed from the parity generating and inserting section 13 are virtually inserted into the related 1-block-corresponding set of information code words to reproduce an output-code-word sequence generated by the parity generating and inserting section 13. The DSV circuit 28 accesses the path memory 26, and calculates CDS's of the reproduced output-code-word sequence. The DSV circuit 28 updates the DSV of the path "a" in response to the calculated CDS's. In the path memory 27, the conversion code words pc(1), pc(2), ..., and pc(117) fed from the parity generating and inserting section 13 are virtually inserted into the related 1-block-corresponding set of information code words to reproduce an output-code-word sequence generated by the parity generating and inserting section 13. The DSV circuit 29 accesses the path memory 27, and calculates CDS's of the reproduced output-code-word sequence. The DSV circuit 29 updates the DSV of the path "b" in response to the calculated CDS's.

Figure 9:
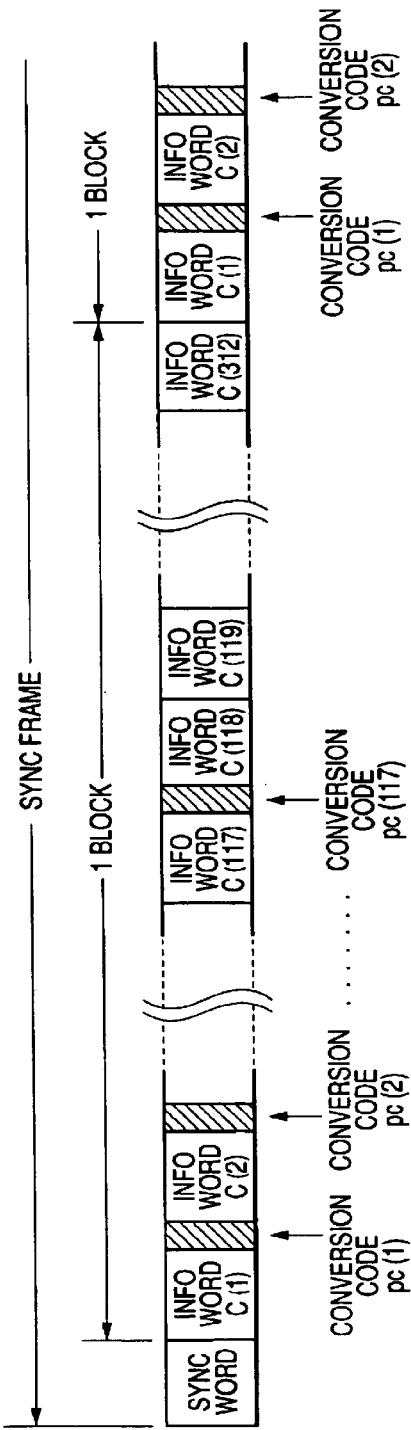
FIG. 9 is a diagram showing a first example of the structure of an output-code-word sequence generated by the parity generating and inserting section.
Figure 10:
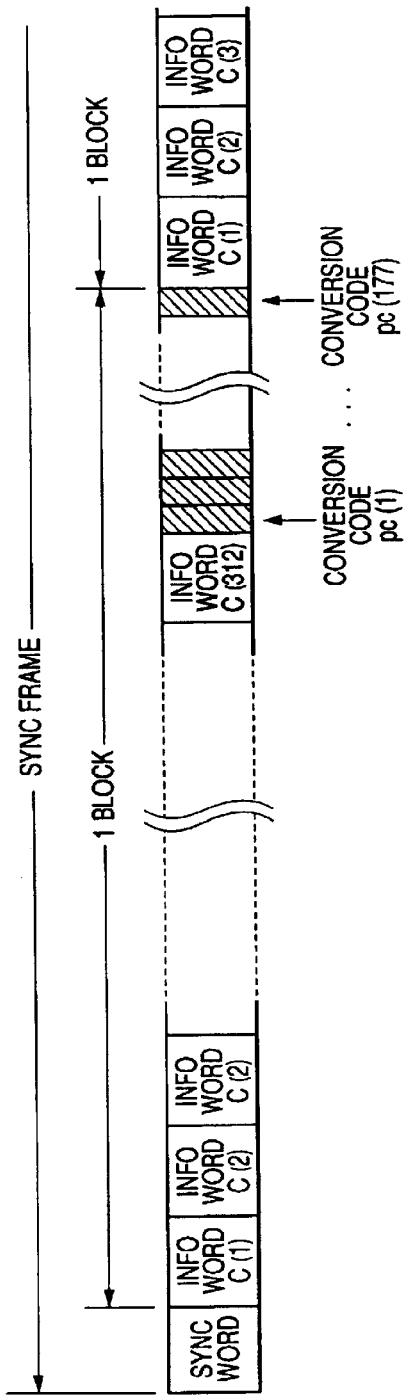
FIG. 10 is a diagram showing a second example of the structure of the output-code-word sequence generated by the parity generating and inserting section.

As previously mentioned, the parity generating and inserting section 13 feeds a sequence of output code words to the NRZI conversion circuit 14. For every block, the output-code-word sequence is composed of information code words C(1), C(2), ..., and C(312) and 3-bit conversion code words pc(1), pc(2), ..., and pc(117) which are arranged into "C(1), pc(1), C(2), pc(2), ..., C(117), pc(117), C(118), C(119), ..., C(312)" as shown in FIG. 9. It should be noted that information code words C(1), C(2), ..., and C(312) and 3-bit conversion code words pc(1), pc(2), ..., and pc(117) may be arranged into "C(1), C(2), ..., C(312), pc(1), pc(2), ..., pc(117)" as shown in FIG. 10. The output-code-word sequence obeys (1, 9) RLL, and results from the DSV control.

The 4-6 modulating section 12 and the parity generating and inserting section 13 may be formed by a digital signal processor, a CPU, or a similar device including a combination of an input/output port, a processing portion, a ROM, and a RAM. In this case, the 4-6 modulating section 12 and the parity generating and inserting section 13 operate in accordance with a control program stored in the ROM or the RAM. The encoding tables 23 are provided in the ROM or the RAM. The path memories 26 and 27 are provided in the RAM.

Figure 11:
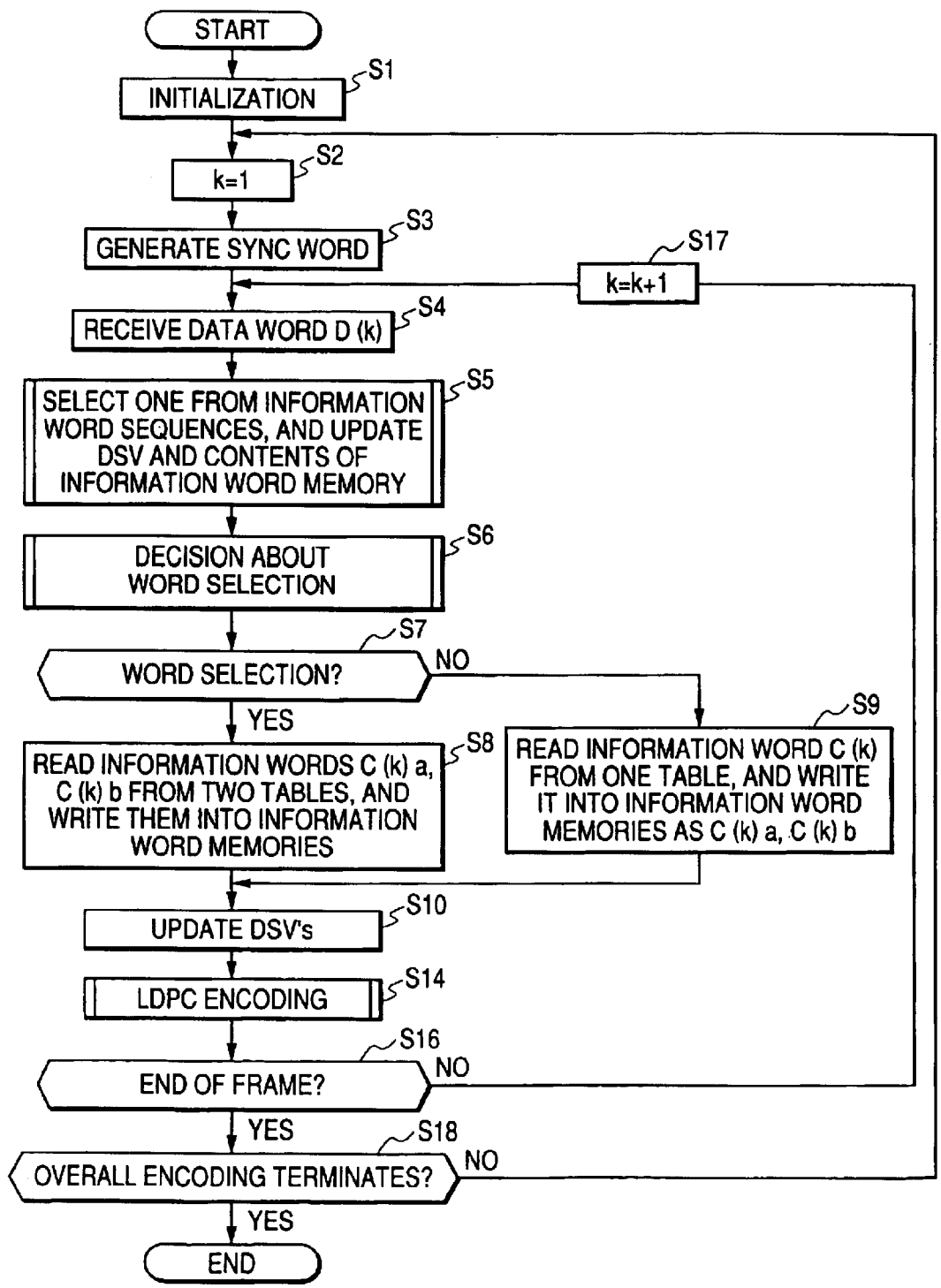
FIG. 11 is a flowchart of a main routine of a control program for the 4-6 modulating section and the parity generating and inserting section in FIGS. 1 and 2.

FIG. 11 is a flowchart of a main segment (routine) of the control program for the 4-6 modulating section 12 and the parity generating and inserting section 13. The program segment in FIG. 11 is started when the overall encoding (modulation) procedure is requested to begin.

As shown in FIG. 11, a first step S1 of the program segment initializes the current-table selection number Snow, the DSV of the path "a", and the DSV of the path "b". In other words, the step S1 sets the current-table selection number Snow, the DSV of the path "a", and the DSV of the path "b" to predetermined initial values respectively. Furthermore, the step S1 clears the path memories 26 and 27. After the step S1, the program advances to a step S2.

The step S2 sets a variable "k" to "1". The variable "k" denotes an order number of a current input data word which is defined regarding one frame.

A step S3 following the step S2 generates a sync word. The step S3 calculates the CDS of the sync word, and updates the DSV's of the paths "a" and "b" in accordance with the calculated CDS. The step S3 outputs the sync word to the NRZI conversion circuit 14. The step S3 may writes the sync word into the path memories 26 and 27 before outputting it to the NRZI conversion circuit 14. After the step S3, the program advances to a step S4.

The step S4 accepts a current input data word D(k).

A block S5 subsequent to the step S4 selects one from a set of information code words in the path memory 26 and a set of information code words in the path memory 27 in response to the DSV's of the paths "a" and "b". The block S5 stores the selected information-code-word set in an LDPC encoding memory (a buffer memory) provided in the RAM. The block S5 updates one of the DSV's which relates to the non-selected information-code-word set. Furthermore, the block S5 updates the contents of one of the path memories 26 and 27 which corresponds to the non-selected information-code-word set.

A block S6 following the block S5 decides whether a word selection is present or absent regarding the current input data word D(k). When a word selection is decided to be present, the block S6 defines the current-table selection number Snow as original one Snowa. In addition, the block S6 determines an additional current-table selection number Snowb on the basis of parameters including the original one Snowa. On the other hand, when a word selection is decided to be absent, the block S6 defines the current-table selection number Snow as original one Snowa but performs nothing about an additional current-table selection number Snowb.

A step S7 subsequent to the block S6 determines whether or not a word selection has been performed for the latest information code word. When a word selection has been performed for the latest information code word, the program advances from the step S7 to a step S9. Otherwise, the step S7 checks the result of the decision by the block S6. When the decision result indicates the presence of a word selection, the program advances from the step S7 to a step S8. When the decision result indicates the absence of a word selection, the program advances from the step S7 to the step S9.

The step S8 selects one from the encoding tables 23 which has an ID number equal to the original current-table selection number Snowa given by the block S6. The step S8 reads out, from the selected encoding table 23, an information code word C(k)a and a next-table selection number Snext assigned to the current input data word D(k). The step S8 writes the read-out information code word C(k)a into the path memory 26 as a candidate information code word in the path "a". The step S8 updates the current-table selection number Snow to the read-out next-table selection number Snext. In addition, the step S8 selects one from the encoding tables 23 which has an ID number equal to the additional current-table selection number Snowb given by the block S6. The step S8 reads out, from the selected encoding table 23, an information code word C(k)b assigned to the current input data word D(k). The step S8 writes the read-out information code word C(k)b into the path memory 27 as a candidate information code word in the path "b". After the step S8, the program advances to a step S10.

The step S9 selects one from the encoding tables 23 which has an ID number equal to the current-table selection number Snow. The step S9 reads out, from the selected encoding table 23, an information code word C(k) and a next-table selection number Snext assigned to the current input data word D(k). The step S9 writes the read-out information code word C(k) into the path memory 26 as one denoted by C(k)a. Similarly, the step S9 writes the read-out information code word C(k) into the path memory 27 as one denoted by C(k)b. The step S9 updates the current-table selection number Snow to the read-out next-table selection number Snext. After the step S9, the program advances to the step S10.

The step S10 calculates a CDS of the latest information code word C(k)a in the path memory 26, and updates the path-"a" DSV of the latest information code word C(k)a and previous information code words in response to the calculated CDS. Similarly, the step S10 calculates a CDS of the latest information code word C(k)b in the path memory 27, and updates the path-"b" DSV of the latest information code word C(k)b and previous information code words in response to the calculated CDS.

A block S14 following the step S10 calculates the total number of information code words in the LDPC encoding memory which have not yet been subjected to LDPC encoding. When the calculated total number is equal to 312 or greater, the block S14 reads out 312 older ones among the counted information code words from the LDPC encoding memory and then erases them from the LDPC encoding memory. The block S14 calculates 117 check bits from the 312 read-out information code words and the parity generation matrix H. The block S14 changes the 117 check bits into corresponding 3-bit conversion code words, respectively. The block S14 combines the 312 read-out information code words and the 117 conversion code words into a sequence of output code words. The block S14 feeds the output-code-word sequence to the NRZI conversion circuit 14. The block S14 writes the 117 conversion code words into the path memories 26 and 27. The block S14 virtually inserts the 117 conversion code words into the related 1-block-corresponding set of information code words in the path memory 26 to reproduce an output-code-word sequence outputted to the NRZI conversion circuit 14. The block S14 calculates CDS's of the reproduced output-code-word sequence. The block S14 updates the DSV of the path "a" in response to the calculated CDS's. In addition, the block S14 virtually inserts the 117 conversion code words into the related 1-block-corresponding set of information code words in the path memory 27 to reproduce an output-code-word sequence outputted to the NRZI conversion circuit 14. The block S14 calculates CDS's of the reproduced output-code-word sequence. The block S14 updates the DSV of the path "b" in response to the calculated CDS's.

Alternatively, the block S14 may simply calculate the CDS's of the 117 conversion code words. In this case, the block S14 updates the DSV's of the paths "a" and "b" in response to the calculated CDS's.

A step S16 subsequent to the block S14 determines whether or not the current input data word D(k) is the last one in the present frame. When the current input data word D(k) is the last one in the present frame, the program advances from the step S16 to a step S18. Otherwise, the program advances from the step S16 to a step S17.

The step S17 increments the value "k" by "1". After the step S17, the program returns to the step S4.

The step S18 determines whether or not the overall encoding procedure should be terminated. When the overall encoding procedure should be terminated, the step S18 selects one from a set of information code words in the path memory 26 and a set of information code words in the path memory 27 in response to the DSV's of the paths "a" and "b" as the block S5 does. The step S18 stores the selected information-code-word set in the LDPC encoding memory. The step S18 implements the LDPC encoding of information code words in the LDPC encoding memory as the block S14 does. The step S18 feeds an output-code-word sequence, which results from the LDPC encoding, to the NRZI conversion circuit 14. Then, the program exits from the step S18, and the current execution cycle of the program segment ends. On the other hand, when the overall encoding procedure should not be terminated, the program returns from the step S18 to the step S2.

Figure 12:
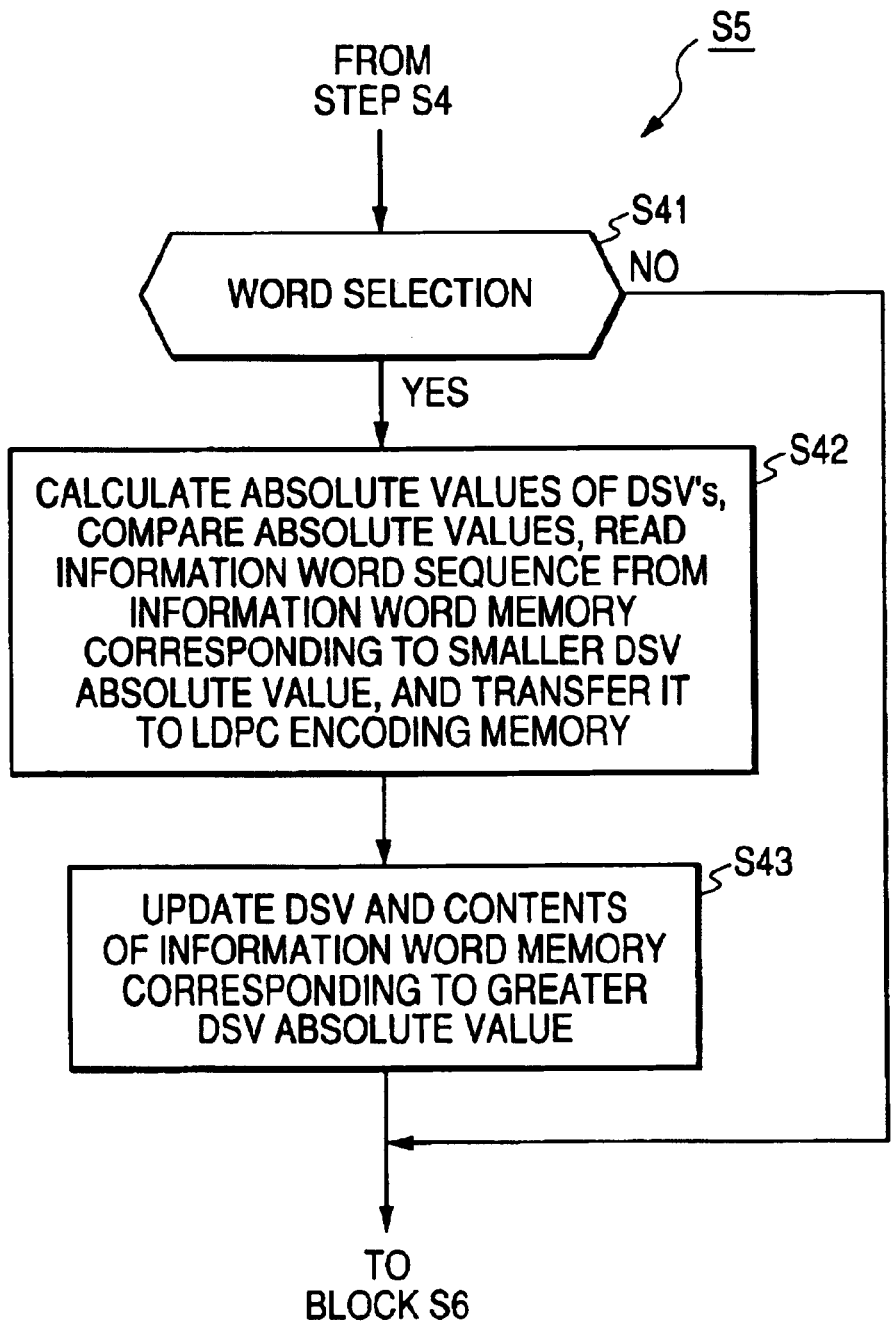
FIG. 12 is a flowchart of the contents of a first block in FIG. 11.

As shown in FIG. 12, the block S5 includes steps S41, S42, and S43. The step S41 follows the step S4 in FIG. 11. The step S41 checks the result of the latest decision by the block S6. When the decision result indicates the presence of a word selection, the program advances from the step S41 to the step S42. When the decision result indicates the absence of a word selection, the program advances from the step S41 to the block S6 in FIG. 11.

The step S42 calculates the absolute values of the DSV's of the paths "a" and "b" and compares the absolute values to decide which of the two is smaller. When the absolute value of the path-"a" DSV is equal to or smaller than that of the path-"b" DSV, the step S42 reads out successive information code words from the path memory 26 and transfers them to the LDPC encoding memory as finally-selected information code words. The oldest one among the transferred information code words is the candidate one corresponding to the last word selection. When the absolute value of the path-"a" DSV is greater than that of the path-"b" DSV, the step S42 reads out successive information code words from the path memory 27 and transfers them to the LDPC encoding memory as finally-selected information code words. The oldest one among the transferred information code words is the candidate one corresponding to the last word selection.

The step S43 follows the step S42. When the step S42 determines that the absolute value of the path-"a" DSV is equal to or smaller than that of the path-"b" DSV, the step S43 updates the DSV of the path "b" to the DSV of the path "a". Furthermore, the step S43 updates the contents (the stored information code words) of the path memory 27 to those of the path memory 26. On the other hand, when the step S42 determines that the absolute value of the path-"a" DSV is greater than that of the path-"b" DSV, the step S43 updates the DSV of the path "a" to the DSV of the path "b". Furthermore, the step S43 updates the contents (the stored information code words) of the path memory 26 to those of the path memory 27. After the step S43, the program advances to the block S6 in FIG. 11.

Figure 13:
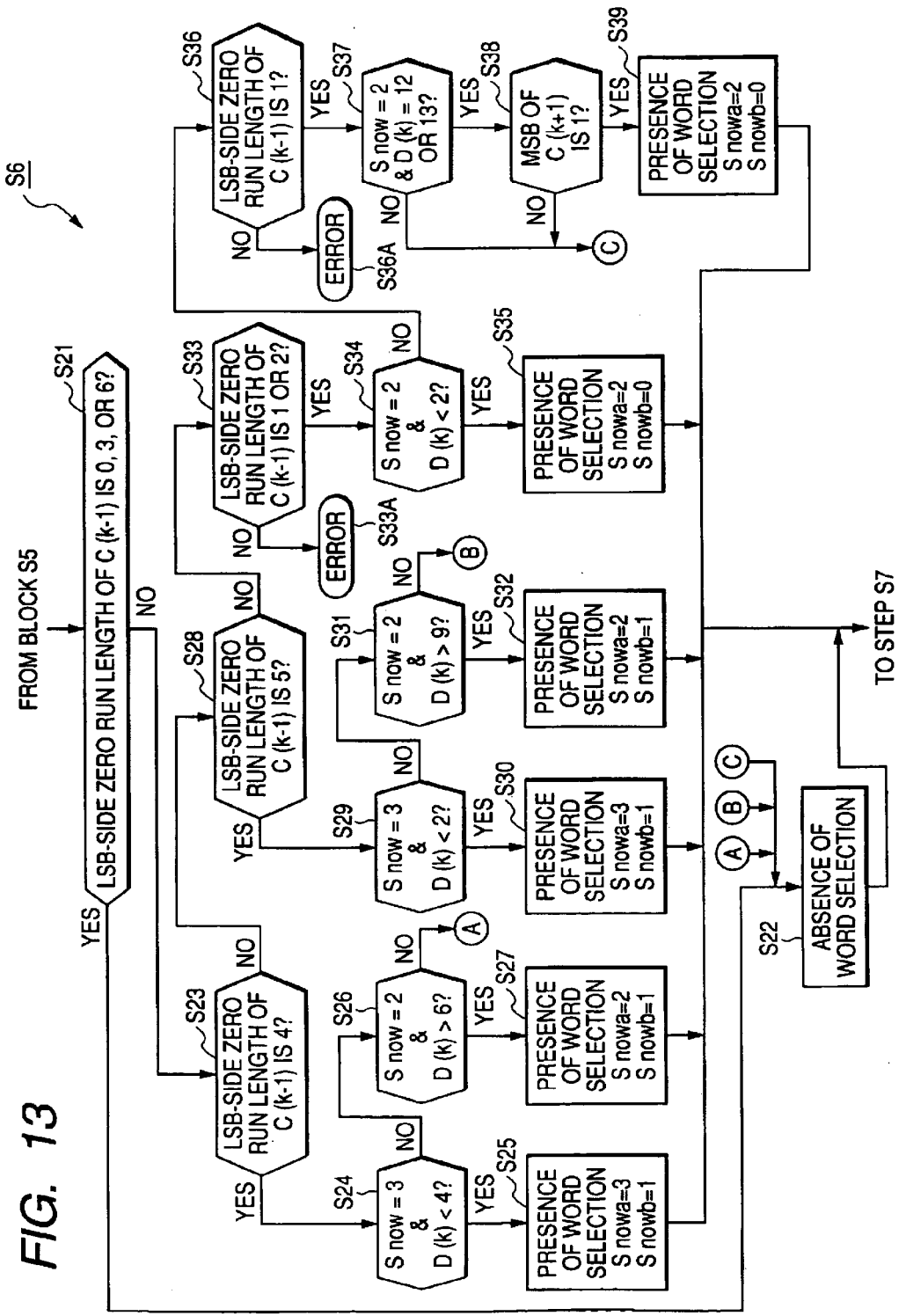
FIG. 13 is a flowchart of the contents of a second block in FIG. 11.

FIG. 13 shows the contents of the block S6 in FIG. 11. As shown in FIG. 13, the block S6 has a first step S21 which follows the block S5 of FIG. 11. The step S21 detects the zero run length (zero run number) of the LSB side of the latest information code word C(k−1), namely, the latest information code word C(k−1)a. The step S21 determines whether or not the detected LSB-side zero run length is one of "0", "3", and "6". When the detected LSB-side zero run length is one of "0", "3", and "6", the program advances from the step S21 to a step S22. Otherwise, the program advances from the step S21 to a step S23.

The step S23 determines whether or not the detected LSB-side zero run length of the latest information code word C(k−1) is "4". When the detected LSB-side zero run length is "4", the program advances from the step S23 to a step S24. Otherwise, the program advances from the step S23 to a step S28.

The step S24 checks the current input data word D(k) and the current-table selection number Snow. The step S24 determines whether or not the current-table selection number Snow is "3" and the current input data word D(k) is less than "4" (decimal). When the current-table selection number Snow is "3" and the current input data word D(k) is less than "4", the program advances from the step S24 to a step S25. Otherwise, the program advances from the step S24 to a step S26.

The step S26 determines whether or not the current-table selection number Snow is "2" and the current input data word D(k) is greater than "6" (decimal). When the current-table selection number Snow is "2" and the current input data word D(k) is greater than "6", the program advances from the step S26 to a step S27. Otherwise, the program advances from the step S26 to the step S22.

The step S28 determines whether or not the detected LSB-side zero run length of the latest information code word C(k−1) is "5". When the detected LSB-side zero run length is "5", the program advances from the step S28 to a step S29. Otherwise, the program advances from the step S28 to a step S33.

The step S29 checks the current input data word D(k) and the current-table selection number Snow. The step S29 determines whether or not the current-table selection number Snow is "3" and the current input data word D(k) is less than "2" (decimal). When the current-table selection number Snow is "3" and the current input data word D(k) is less than "2", the program advances from the step S29 to a step S30. Otherwise, the program advances from the step S29 to a step S31.

The step S31 determines whether or not the current-table selection number Snow is "2" and the current input data word D(k) is greater than "9" (decimal). When the current-table selection number Snow is "2" and the current input data word D(k) is greater than "9", the program advances from the step S31 to a step S32. Otherwise, the program advances from the step S31 to the step S22.

The step S33 determines whether or not the detected LSB-side zero run length of the latest information code word C(k−1) is one of "1" and "2". When the detected LSB-side zero run length is one of "1" and "2", the program advances from the step S33 to a step S34. Otherwise, the program advances from the step S33 to a step S33A.

The step S33A sets an error indication flag. After the step S33A, the program may return to the step S21.

The step S34 checks the current input data word D(k) and the current-table selection number Snow. The step S34 determines whether or not the current-table selection number Snow is "2" and the current input data word D(k) is less than "2" (decimal). When the current-table selection number Snow is "2" and the current input data word D(k) is less than "2", the program advances from the step S34 to a step S35. Otherwise, the program advances from the step S34 to a step S36.

The step S36 determines whether or not the detected LSB-side zero run length of the latest information code word C(k−1) is "1". When the detected LSB-side zero run length is "1", the program advances from the step S36 to a step S37. Otherwise, the program advances from the step S36 to a step S36A.

The step S36A sets the error indication flag. After the step S36A, the program may return to the step S21.

The step S37 checks the current input data word D(k) and the current-table selection number Snow. The step S37 determines whether or not the current-table selection number Snow is "2" and the current input data word D(k) is one of "12" and "13" (decimal). When the current-table selection number Snow is "2" and the current input data word D(k) is one of "12" and "13", the program advances from the step S37 to a step S38. Otherwise, the program advances from the step S37 to the step S22.

The step S38 decides an information code word C(k+1) assigned to a next input data word D(k+1), that is, an input data word D(k+1) immediately following the current input data word D(k). Specifically, the step S38 accepts the next input data word D(k+1). The step S38 decides an information code word C(k) immediately following the latest information code word C(k−1) in response to the current input data word D(k) by referring to the encoding table 23 having an ID number of "0" or "2". The step S38 reads out a next-table selection number Snext accompanying the decided information code word C(k) from the present encoding table 23. The step S38 reads out an information code word C(k+1) assigned to the next input data word D(k+1) from the encoding table 23 having an ID number equal to the read-out next-table selection number Snext. Thereafter, the step S38 determines whether or not the MSB of the read-out information code word C(k+1) is "1". When the MSB of the read-out information code word C(k+1) is "1", the program advances from the step S38 to a step S39. Otherwise, the program advances from the step S38 to the step S22.

The step S22 generates a decision result indicating the absence of a word selection. After the step S22, the program advances to the step S7 in FIG. 11.

The step S25 generates a decision result indicating the presence of a word selection. The step S25 sets the original current-table selection number Snowa to "3" (the current-table selection number Snow). The step S25 sets the additional current-table selection number Snowb to "1". After the step S25, the program advances to the step S7 in FIG. 11.

The step S27 generates a decision result indicating the presence of a word selection. The step S27 sets the original current-table selection number Snowa to "2" (the current-table selection number Snow). The step S27 sets the additional current-table selection number Snowb to "1". After the step S27, the program advances to the step S7 in FIG. 11.

The step S30 generates a decision result indicating the presence of a word selection. The step S30 sets the original current-table selection number Snowa to "3" (the current-table selection number Snow). The step S30 sets the additional current-table selection number Snowb to "1". After the step S30, the program advances to the step S7 in FIG. 11.

The step S32 generates a decision result indicating the presence of a word selection. The step S32 sets the original current-table selection number Snowa to "2" (the current-table selection number Snow). The step S32 sets the additional current-table selection number Snowb to "1". After the step S32, the program advances to the step S7 in FIG. 11.

The step S35 generates a decision result indicating the presence of a word selection. The step S35 sets the original current-table selection number Snowa to "2" (the current-table selection number Snow). The step S35 sets the additional current-table selection number Snowb to "0". After the step S35, the program advances to the step S7 in FIG. 11.

The step S39 generates a decision result indicating the presence of a word selection. The step S39 sets the original current-table selection number Snowa to "2" (the current-table selection number Snow). The step S39 sets the additional current-table selection number Snowb to "0". After the step S39, the program advances to the step S7 in FIG. 11.

Figure 14:
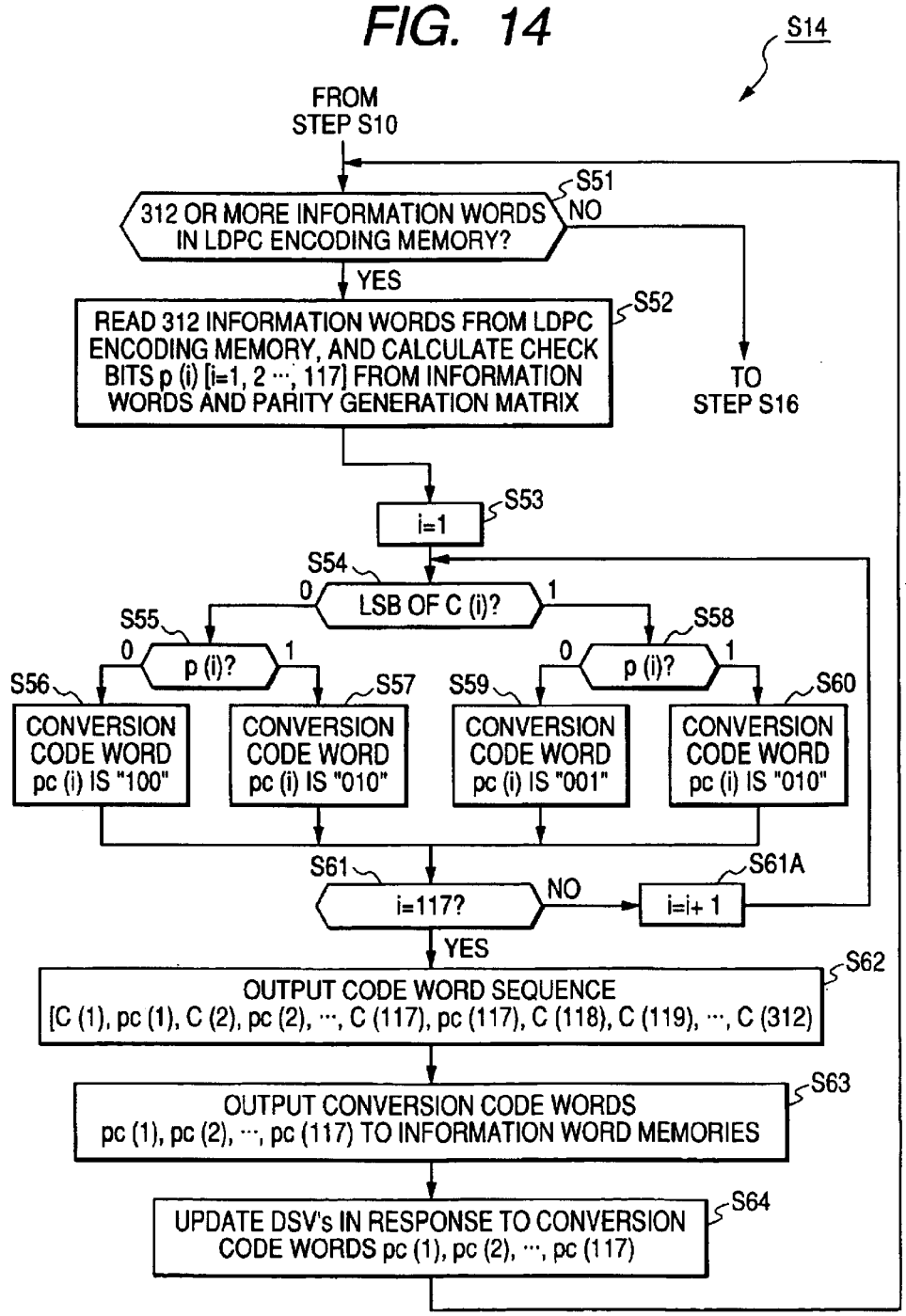
FIG. 14 is a flowchart of the contents of a third block in FIG. 11.

FIG. 14 shows the contents of the block S14 in FIG. 11. As shown in FIG. 14, the block S14 has a first step S51 which follows the step S10 of FIG. 11. The step S51 counts information code words in the LDPC encoding memory which have not yet been subjected to LDPC encoding. The step S51 calculates the total number of the counted information code words. When the calculated total number is equal to 312 or greater, the program advances from the step S51 to a step S52. Otherwise, the program advances from the step S51 to the step S16 in FIG. 11.

The step S52 reads out 312 older ones among the counted information code words from the LDPC encoding memory and then erases them from the LDPC encoding memory. The 312 read-out information code words are denoted by C(1), C(2), ..., and C(312), respectively. The step S52 calculates 117 check bits p(1), p(2), ..., and p(117) from the 312 read-out information code words C(1), C(2), ..., and C(312) and the parity generation matrix H.

A step S53 following the step S52 sets a variable "i" to "1". The variable "i" is used to designate one among the 312 read-out information code words C(1), C(2), ..., and C(312), one among the 117 calculated check bits p(1), p(2), ..., and p(117), and one among conversion code words pc(1), pc(2), ..., and pc(117). After the step S53, the program advances to a step S54.

The step S54 checks the LSB of the information code word C(i). When the LSB of the information code word C(i) is "0", the program advances from the step S54 to a step S55. When the LSB of the information code word C(i) is "1", the program advances from the step S54 to a step S58.

The step S55 determines whether the check bit p(i) is "0" or "1". When the check bit p(i) is "0", the program advances from the step S55 to a step S56. When the check bit p(i) is "1", the program advances from the step S55 to a step S57.

The step S58 determines whether the check bit p(i) is "0" or "1". When the check bit p(i) is "0", the program advances from the step S58 to a step S59. When the check bit p(i) is "1", the program advances from the step S58 to a step S60.

The step S56 sets a conversion code word pc(i) to "100" for the check bit p(i). In other words, the step S56 changes the check bit p(i) to a conversion code word pc(i) of "100". The step S56 stores the conversion code word pc(i) into the RAM. After the step S56, the program advances to a step S61.

The step S57 sets a conversion code word pc(i) to "010" for the check bit p(i). In other words, the step S57 changes the check bit p(i) to a conversion code word pc(i) of "010". The step S57 stores the conversion code word pc(i) into the RAM. After the step S57, the program advances to the step S61.

The step S59 sets a conversion code word pc(i) to "001" for the check bit p(i). In other words, the step S59 changes the check bit p(i) to a conversion code word pc(i) of "001". The step S59 stores the conversion code word pc(i) into the RAM. After the step S59, the program advances to the step S61.

The step S60 sets a conversion code word pc(i) to "010" for the check bit p(i). In other words, the step S60 changes the check bit p(i) to a conversion code word pc(i) of "010". The step S60 stores the conversion code word pc(i) into the RAM. After the step S60, the program advances to the step S61.

The step S61 determines whether or not the value "i" is equal to 117. When the value "i" is equal to 117, the program advances from the step S61 to a step S62. Otherwise, the program advances from the step S61 to a step S61A.

The step S61A increments the value "i" by "1". After the step S61A, the program returns to the step S54.

The step S62 retrieves the conversion code words pc(1), pc(2), ..., and pc(117) from the RAM. The step S62 combines the information code words C(1), C(2), ..., and C(312) and the conversion code words pc(1), pc(2), ..., and pc(117) into a sequence of output code words expressed as "C(1), pc(1), C(2), pc(2), ..., C(117), pc(117), C(118), C(119), ..., C(312)". The step S62 feeds the output-code-word sequence to the NRZI conversion circuit 14.

A step S63 following the step S62 writes the conversion code words pc(1), pc(2), ..., and pc(117) into each of the path memories 26 and 27.

A step S64 subsequent to the step S63 accesses the path memory 26, and updates the DSV of the path "a" in response to the conversion code words pc(1), pc(2), ..., and pc(117). Furthermore, the step S64 accesses the path memory 27, and updates the DSV of the path "b" in response to the conversion code words pc(1), pc(2), ..., and pc(117). After the step S64, the program returns to the step S51.

Doubling 4-bit input data words and 6-bit information code words result in 8-bit input data words and 12-bit information code words. Tripling 4-bit input data words and 6-bit information code words result in 12-bit input data words and 18-bit information code words. Accordingly, input data words may be of the m-bit type and information code words may be of the n-bit type, where the bit number "m" is equal to 4 multiplied by a predetermined natural number and the bit number "n" is equal to 6 multiplied by the predetermined natural number.

The output-code-word sequence generated by the parity generating and inserting section 13 may be used for the generation of a 17 pp code regarding a Blue-ray Disc format (Blue-ray Disc System Description, Blue-ray Disc Rewritable Format Part 1).

The number of information code word bits in one block may be increased from 1872 while the number of check bits therein may be decreased from 117.

Parity bits (check bits) may be generated for every sync word as those are generated for every block of information code words. In this case, the generated parity bits are added to the sync word.

Second Embodiment

Figure 15:
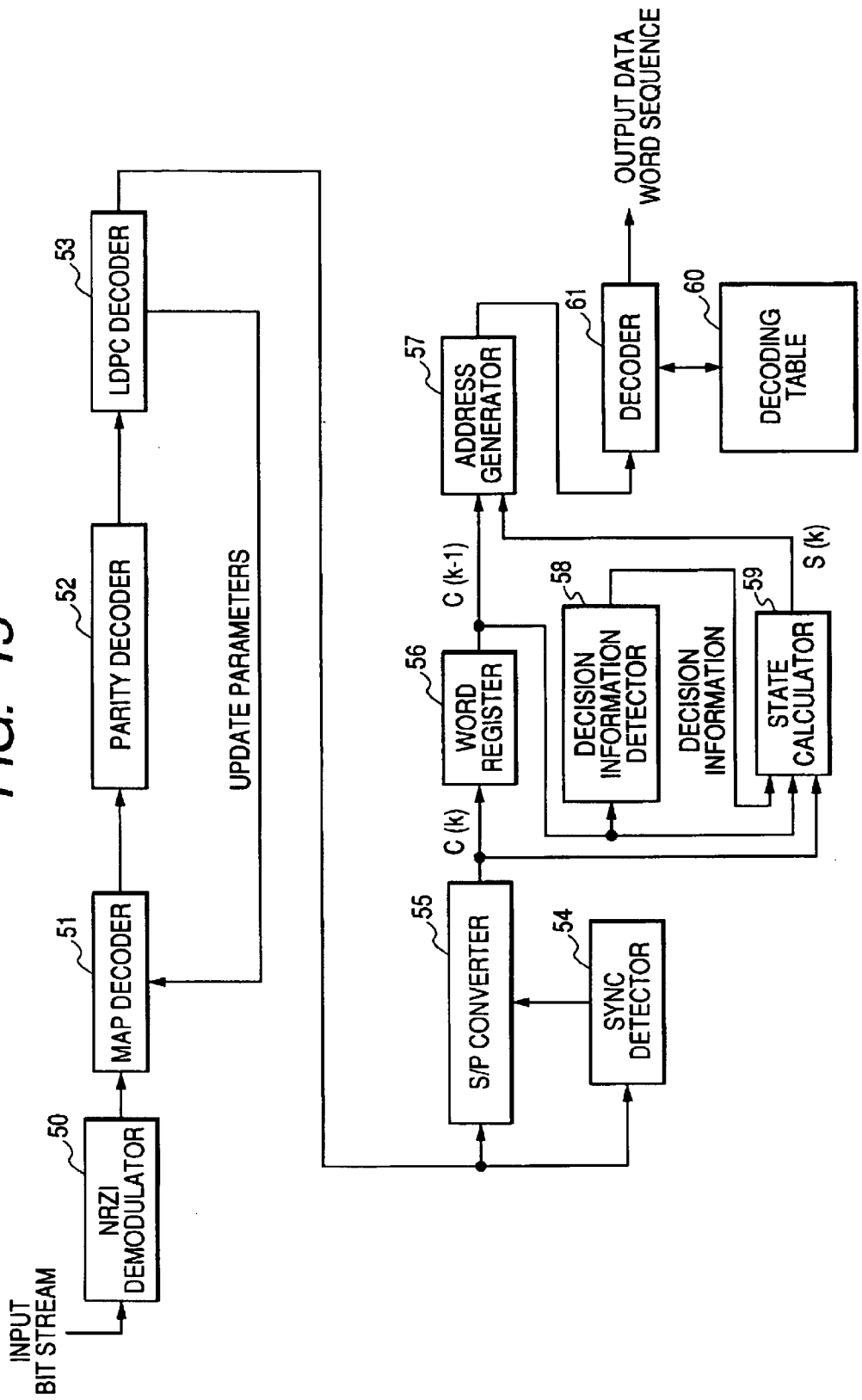
FIG. 15 is a block diagram of an information demodulating apparatus according to a second embodiment of this invention.

FIG. 15 shows an information demodulating apparatus according to a second embodiment of this invention. The information demodulating apparatus receives an input bit stream generated by, for example, the information modulating apparatus 1 in FIG. 1. The input bit stream corresponds to, for example, the output signal of the NRZI conversion circuit 14 in FIG. 1. The information demodulating apparatus recovers original data words from the input bit stream.

The information demodulating apparatus in FIG. 15 includes an NRZI demodulator 50, a MAP decoder 51, a parity decoder 52, an LDPC decoder 53, a sync detector 54, a serial-to-parallel (S/P) converter 55, a word register 56, an address generator 57, a code-word decision-information detector 58, a state calculator 59, a decoding table 60, and a decoder 61.

The NRZI demodulator 50 receives the input bit stream. The NRZI demodulator 50 is connected with the MAP decoder 51. The MAP decoder 51 is connected with the parity decoder 52 and the LDPC decoder 53. The parity decoder 52 is connected with the LDPC decoder 53. The LDPC decoder 53 is connected with the sync detector 54 and the S/P converter 55. The sync detector 54 is connected with the S/P converter 55. The S/P converter 55 is connected with the word register 56 and the state calculator 59. The word register 56 is connected with the address generator 57, the code-word decision-information detector 58, and the state calculator 59. The address generator 57 is connected with the state calculator 59 and the decoder 61. The code-word decision-information detector 58 is connected to the state calculator 59. The encoding table 60 can be accessed by the decoder 61.

The NRZI demodulator 50 subjects the input bit stream to NRZI demodulation. The NRZI demodulator 50 outputs the NRZI-demodulation-resultant signal (the NRZI-demodulation-resultant bit stream) to the MAP decoder 51.

Every sync word in the output signal of the NRZI demodulator 50 propagates to the sync detector 54 through the MAP decoder 51, the parity decoder 52, and the LDPC decoder 53.

The MAP decoder 51 processes the output signal of the NRZI demodulator 50 on a block-by-block basis. For every block, the MAP decoder 51 estimates 2223 bits from the output signal of the NRZI demodulator 50 in response to parameters according to a known Maximum A Posteriori Probability (MAP) method. The 2223 estimated bits are denoted by b(1), b(2), . . . , and b(2223), respectively. The 2223 estimated bits correspond to a code-word sequence expressed as "C(1), pc(1), C(2), pc(2), . . . , C(117), pc(117), C(118), C(119), . . . , C(312)". The MAP decoder 51 feeds the 2223 estimated bits to the parity decoder 52.

The parity decoder 52 implements block-by-block processing. Specifically, the parity decoder 52 separates the 2223 estimated bits fed from the MAP decoder 51 into a sequence of first bits representative of estimated information code words and a sequence of second bits representative of estimated 3-bit conversion code words. The first bits are denoted by v(1), v(2), . . . , and v(1872), respectively. The parity decoder 52 extracts the center bits from the estimated 3-bit conversion code words, and sets the extracted center bits as estimated check bits q(1), q(2), . . . , and q(117) respectively. The parity decoder 52 feeds the estimated information-code-word bits v(1), v(2), . . . , and v(1872) and the estimated check bits q(1), q(2), . . . , and q(117) to the LDPC decoder 53.

The LDPC decoder 53 implements block-by-block processing. Specifically, the LDPC decoder 53 receives the estimated information-code-word bits v(1), v(2), . . . , and v(1872) and the estimated check bits q(1), q(2), . . . , and q(117) from the parity decoder 52. The LDPC decoder 53 combines the estimated information-code-word bits and the estimated check bits into a column-direction estimated information vector expressed as [v(1), v(2), . . . , v(1872), q(1), q(2), . . . , q(117)]. The LDPC decoder 53 include a memory storing a signal representing the parity generation matrix H (see FIG. 8). The LDPC decoder 53 multiplies the parity generation matrix H and the estimated information vector. The LDPC decoder 53 checks whether or not the result of the multiplication is equal to "0". When the multiplication result is equal to "0", the LDPC decoder 53 concludes the estimated information-code-word bits v(1), v(2), . . . , and v(1872) to be correct and be the same as the original ones u(1), u(2), . . . , and u(1872). In this case, the LDPC decoder 53 sequentially feeds the correct information-code-word bits v(1), v(2), . . . , and v(1872) to the sync detector 54 and the S/P converter 55 as recovered ones. When the multiplication result is not equal to "0", the LDPC decoder 53 concludes the estimated information-code-word bits v(1), v(2), . . . , and v(1872) to be wrong. In this case, the LDPC decoder 53 accesses the MAP decoder 51 and updates the parameters used therein.

The MAP decoder 51, the parity decoder 52, and the LDPC decoder 53 repeats the foregoing processing in response to the updated parameters so that the LDPC decoder 53 gets an updating-resultant estimated information vector. The LDPC decoder 53 multiplies the parity generation matrix H and the updating-resultant estimated information vector. The LDPC decoder 53 checks whether or not the result of the multiplication is equal to "0". When the multiplication result is equal to "0", the LDPC decoder 53 concludes the updating-resultant estimated information-code-word bits v(1), v(2), . . . , and v(1872) to be correct and be the same as the original ones u(1), u(2), . . . , and u(1872).

In this case, the LDPC decoder 53 sequentially feeds the correct information-code-word bits v(1), v(2), . . . , and v(1872) to the sync detector 54 and the S/P converter 55 as recovered ones. When the multiplication result is not equal to "0", the LDPC decoder 53 concludes the updating-resultant estimated information-code-word bits v(1), v(2), . . . , and v(1872) to be wrong. In this case, the LDPC decoder 53 accesses the MAP decoder 51 and further updates the parameters used therein.

The foregoing sequence of steps of operation of the MAP decoder 51, the parity decoder 52, and the LDPC decoder 53 is reiterated until the multiplication result provided by the LDPC decoder 53 reaches "0". When the multiplication result reaches "0", the LDPC decoder 53 concludes the updating-resultant estimated information-code-word bits v(1), v(2), . . . , and v(1872) to be correct and be the same as the original ones u(1), u(2), . . . , and u(1872). Then, the LDPC decoder 53 sequentially feeds the correct information-code-word bits v(1), v(2), . . . , and v(1872) to the sync detector 54 and the S/P converter 55 as recovered ones.

The LDPC decoder 53 outputs a signal in the form of a bit stream to the sync detector 54 and the S/P converter 55. As understood from the previous explanation, the output signal of the LDPC decoder 53 includes correct information-code-word bits (recovered information-code-word bits) and sync words.

The sync detector 54 senses every sync word in the output signal of the LDPC decoder 53. The sync detector 54 generates a word clock signal in response to the sensed sync words. The sync detector 54 feeds the generated word clock signal to the S/P converter 55.

The S/P converter 55 subjects the bit stream from the LDPC decoder 53 to serial-to-parallel conversion in response to the word clock signal, thereby periodically generating a 6-bit parallel-form signal segment handled as an information code word C(k). Thus, the S/P converter 55 changes the received bit stream into a sequence of information code words. The S/P converter 55 outputs the information code word C(k) to the word register 56 and the state calculator 59. The information code word C(k) is written into the word register 56. The information code word C(k) is temporarily stored in the word register 56 before being outputted therefrom as a delayed information code word C(k−1). Specifically, the word register 56 delays the information code word C(k) by a time interval corresponding to one word. The delayed information code word C(k−1) is fed from the word register 56 to the address generator 57, the code-word decision-information detector 58, and the state calculator 59.

The code-word decision-information detector 58 detects a code-word-related decision information in response to the delayed information code word C(k−1). The code-word decision-information detector 58 informs the state calculator 59 of the detected decision information. The state calculator 59 computes an encoding state S(k) from the information code word C(k), the detected decision information, and the delayed information code word C(k−1). The computed encoding state S(k) corresponds to the encoding table 23 (see FIGS. 1, 2, and 4) used to generate the information code word C(k). In other words, the computed encoding state S(k) is equal to the next-table selection number Snext accompanying the delayed information code word C(k−1) and used in an encoder side (a modulation side). Thus, the next-table selection number Snext accompanying the delayed information code word C(k−1) is recovered. The state calculator 59 informs the address generator 57 of the encoding state S(k), that is, the next-table selection number Snext accompanying the delayed information code word C(k−1).

The address generator 57 produces an address signal in response to the delayed information code word C(k−1) and the encoding state S(k). The address generator 57 outputs the produced address signal to the decoder 61. The decoding table 60 has an array of 4-bit output data words at different addresses respectively. The decoder 61 accesses the decoding table 60 in response to the address signal. The decoder 61 selects one output data word D(k−1) at an address corresponding to the address signal from the output data words in the decoding table 60. The decoder 61 feeds the selected output data word D(k−1) to a next stage or an external device as a recovered original data word D(k−1).

Specifically, the decoding table 60 includes an array of cells each having a set of an information code word C(k−1), an output data word D(k−1), and an encoding state S(k). As previously mentioned, the encoding state S(k) corresponds to a next-table selection number Snext accompanying the information code word C(k−1). The information code word C(k−1) and the encoding state S(k) in each cell are used as an indication of an address. An output data word D(k−1) can be decided in response to a set of an information code word C(k−1) and an encoding state S(k) by referring to the decoding table 60. An example of the contents of the decoding table 60 is shown in FIG. 16.

Information code words can be grouped into three cases "0", "1", and "2" according to LSB-side zero run length (LSB-side zero run number). FIG. 17 shows the relation among the cases "0", "1", and "2", the LSB-side zero run lengths, and the encoding states S(k). With reference to FIG. 17, the cases "0", "1", and "2" are given to decision information of "0", "1", and "2", respectively. Specifically, information code words each having an LSB-side zero run length of "0" are assigned to the case "0", that is, decision information of "0". Information code words each having an LSB-side zero run length of "1", "2", or "3" are assigned to the case "1", that is, decision information of "1". Information code words each having an LSB-side zero run length of "4", "5", or "6" are assigned to the case "2", that is, decision information of "2".

Each of the information code words in the case "0" (corresponding to decision information of "0") is always followed by an information code word which results from an encoding procedure using the encoding table 23 having an ID number equal to a next-table selection number Snext of "0" or "1". Therefore, the case "0" relates to encoding states S(k) of "0" and "1". Each of the information code words in the case "1" (corresponding to decision information of "1") is always followed by an information code word which results from an encoding procedure using the encoding table 23 having an ID number equal to a next-table selection number Snext of "1", "2", or "3". Therefore, the case "1" relates to encoding states S(k) of "1", "2", and "3". Each of the information code words in the case "2" (corresponding to decision information of "2") is always followed by an information code word which results from an encoding procedure using the encoding table 23 having an ID number equal to a next-table selection number Snext of "2" or "3". Therefore, the case "2" relates to encoding states S(k) of "2" and "3".

The code-word decision-information detector 58 contains a table representative of the previously-mentioned assignment of the information code words to the cases "0", "1", and "2" (decision information of "0", "1", and "2") which depends on the LSB-side zero run length. The code-word decision-information detector 58 detects the LSB-side zero run length of the delayed information code word C(k−1). The code-word decision-information detector 58 accesses the assignment table in response to the detected zero run length, and thereby detects the decision information corresponding to the delayed information code word C(k−1). The code-word decision-information detector 58 informs the state calculator 59 of the detected decision information. The state calculator 59 computes an encoding state S(k) from the information code word C(k), the delayed information code word C(k−1), and the detected decision information according to a predetermined algorithm. The computed encoding state S(k) corresponds to the encoding table 23 used to generate the information code word C(k). In other words, the computed encoding state S(k) is equal to the next-table selection number Snext accompanying the delayed information code word C(k−1) and used in an encoder side. The state calculator 59 notifies the encoding state S(k), that is, the next-table selection number Snext accompanying the delayed information code word C(k−1), to the address generator 57.

As previously mentioned, the address generator 57 produces an address signal in response to the delayed information code word C(k−1) and the encoding state S(k). The address generator 57 outputs the produced address signal to the decoder 61. The decoder 61 accesses the decoding table 60 in response to the address signal. The decoder 61 reads out an output data word D(k−1) corresponding to the address signal, that is, an output data word D(k−1) corresponding to a set of the delayed information code word C(k−1) and the encoding state S(k), from the encoding table 60. The decoder 61 feeds the read-out output data word D(k−1) to a next stage or an external device as a recovered original data word D(k−1).

An example of the predetermined algorithm used by the state calculator 59 is as follows.

Algorithm in C-language-based Version:
if (decision information==0[
  if (C(k) is in encoding table having ID of 0)
    S(k)=0;
  elseif (C(k) is in encoding table having ID of 1)
    S(k)=1;]
if (decision information==1[
  elseif (C(k) is in encoding table having ID of 1)
    S(k)=1;
  elseif (C(k) is in encoding table having ID of 2)
    S(k)=2;
  elseif (C(k) is in encoding table having ID of 3∥1)
    S(k)=3;
  elseif (C(k)==0 && C(k−1)==32)
    S(k)=3;
  elseif (C(k)==0 && C(k−1)==42)
    S(k)=2;]
if (decision information==2[
  if (C(k) is in encoding table having ID of 3∥9∥5'∥2)
    S(k)=3;
  elseif (C(k) is in encoding table having ID of 2∥4∥10∥8)
    S(k)=2;
  elseif (C(k)==21)
    S(k)=0;]

In the above algorithm: "==" denotes "equal to"; "&&" denotes "and"; and "∥" denotes "or".

FIG. 18 shows a succession of information code words of "010000", "001001", "00001", "000101", and "010001". In the case where the information code word C(k−1) of interest is "01000" and the immediately-following information code word C(k) is "001001", since the LSB-side zero run length of the information code word C(k−1) is "4", the decision information corresponding to the information code word C(k−1) is found to be "2" by referring to the previously-mentioned assignment table. The encoding state S(k), that is, the next-table selection number Snext accompanying the information code word C(k−1), is found to be "3" according to the predetermined algorithm using the information code word C(k) and the decision information of "2". The information code word C(k−1) of interest is decoded into an output data word D(k−1) of "15" in decimal by referring to the decoding table (see FIG. 16).

In the case where the information code word C(k−1) of interest is "001001" and the immediately-following information code word C(k) is "000001", since the LSB-side zero run length of the information code word C(k−1) is "0", the decision information corresponding to the information code word C(k−1) is found to be "0" by referring to the previously-mentioned assignment table. The encoding state S(k), that is, the next-table selection number Snext accompanying the information code word C(k−1), is found to be "0" according to the predetermined algorithm using the information code word C(k) and the decision information of "0". The information code word C(k−1) of interest is decoded into an output data word D(k−1) of "0" in decimal by referring to the decoding table (see FIG. 16).

In the case where the information code word C(k−1) of interest is "000001" and the immediately-following information code word C(k) is "000101", since the LSB-side zero run length of the information code word C(k−1) is "0", the decision information corresponding to the information code word C(k−1) is found to be "0" by referring to the previously-mentioned assignment table. The encoding state S(k), that is, the next-table selection number Snext accompanying the information code word C(k−1), is found to be "1" according to the predetermined algorithm using the information code word C(k) and the decision information of "0". The information code word C(k−1) of interest is decoded into an output data word D(k−1) of "1" in decimal by referring to the decoding table (see FIG. 16).

In the case where the information code word C(k−1) of interest is "000101" and the immediately-following information code word C(k) is "010001", since the LSB-side zero run length of the information code word C(k−1) is "0", the decision information corresponding to the information code word C(k−1) is found to be "0" by referring to the previously-mentioned assignment table. The encoding state S(k), that is, the next-table selection number Snext accompanying the information code word C(k−1), is found to be "0" according to the predetermined algorithm using the information code word C(k) and the decision information of "0". The information code word C(k−1) of interest is decoded into an output data word D(k−1) of "2" in decimal by referring to the decoding table (see FIG. 16).

In FIG. 18, the information code word C(k−1) being "001001" is generated by an encoder side (a modulation side) through the word selection procedure for the DSV control. Specifically, in the encoder side, a first candidate modulation-resultant code word being "101001 and assigned to an original data word of "0" (decimal) is read out from the encoding table 23 (see FIG. 4) having an ID number of "3" while a second candidate modulation-resultant code word being "001001" and assigned to the original data word is read out from the encoding table 23 having an ID number of "1". The encoder side selects the second candidate modulation-resultant code word. Thus, the encoder side uses "001001" instead of "101001". Although the word selection and change are carried out by the encoder side in this way, the information demodulating apparatus in FIG. 15 correctly decodes the information code word C(k−1) being "001001" into an original data word of "0" as previously mentioned.

The devices 51–61 in the information demodulating apparatus of FIG. 15 may be formed by a digital signal processor, a CPU, or a similar device including a combination of an input/output port, a processing portion, a ROM, and a RAM. In this case, the devices 51–61 operate in accordance with a control program stored in the ROM or the RAM. The decoding table 60 and the assignment table (see FIG. 17) are provided in the ROM or the RAM.

Figure 19:
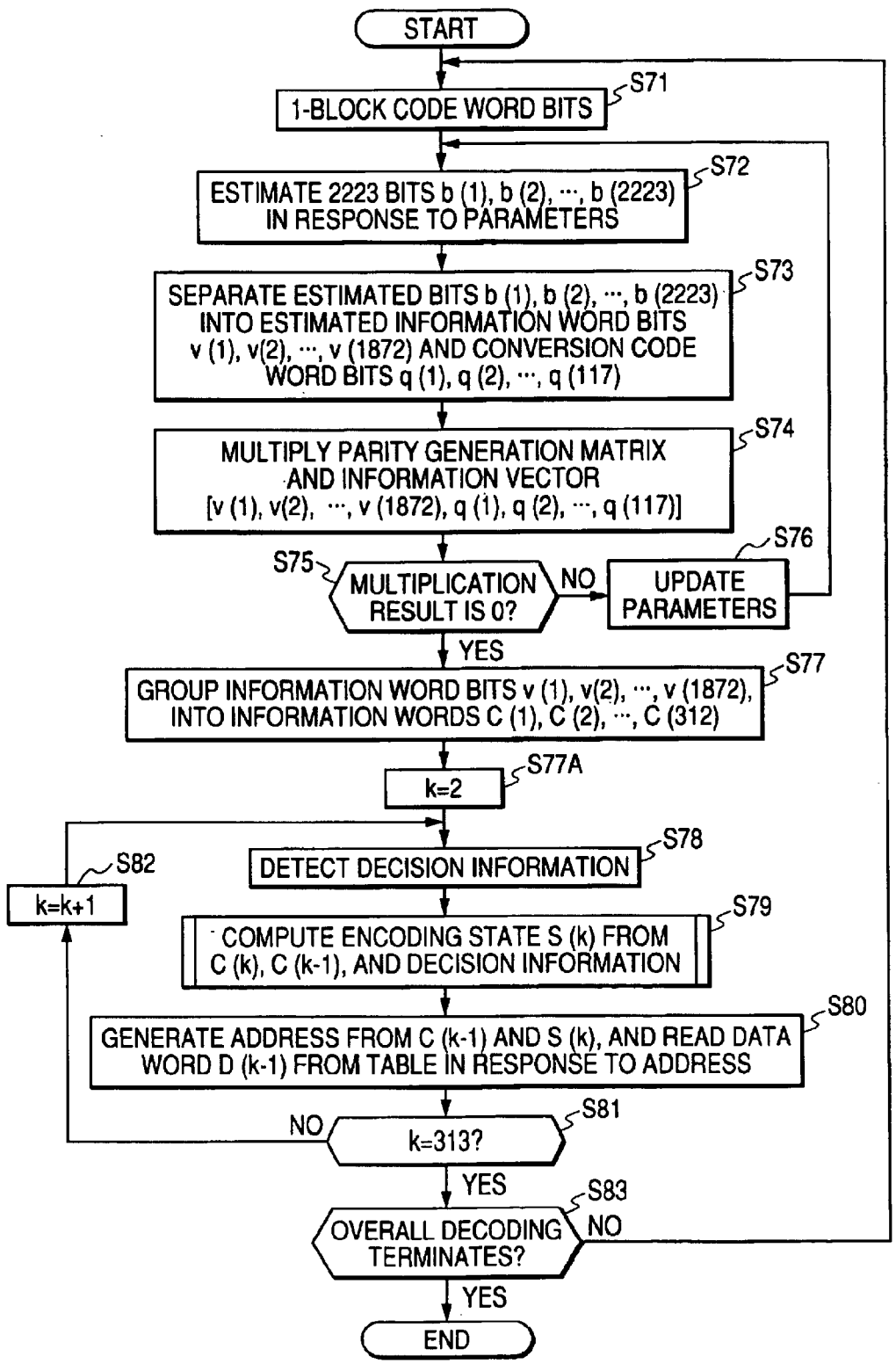
FIG. 19 is a flowchart of a main routine of a control program for a major portion of the information demodulating apparatus in FIG. 15.

FIG. 19 is a flowchart of a main segment (routine) of the control program for the devices 51–61. The program segment in FIG. 11 is started when the overall decoding (demodulation) procedure is requested to begin.

As shown in FIG. 19, a first step S71 of the program segment waits until a received segment of the output signal of the NRZI demodulator 50 which has not been decoded (demodulated) yet reaches a 1-block size. When the received signal segment reaches a 1-block size, the program advances from the step S71 to a step S72.

The step S72 estimates 2223 bits from the latest 1-block-correpsonding segment of the output signal of the NRZI demodulator 50 in response to parameters according to a known Maximum A Posteriori Probability (MAP) method. The 2223 estimated bits are denoted by b(1), b(2), . . . , and b(2223), respectively. The 2223 estimated bits correspond to a code-word sequence expressed as "C(1), pc(1), C(2), pc(2), . . . , C(117), pc(117), C(118), C(119), . . . , C(312)".

A step S73 following the step S72 separates the 2223 estimated bits into a sequence of first bits representative of estimated information code words and a sequence of second bits representative of estimated 3-bit conversion code words. The first bits are denoted by v(1), v(2), . . . , and v(1872), respectively. The step S73 extracts the center bits from the estimated 3-bit conversion code words, and sets the extracted center bits as estimated check bits q(1), q(2), . . . , and q(117) respectively.

A step S74 subsequent to the step S73 combines the estimated information-code-word bits and the estimated check bits into a column-direction estimated information vector expressed as [v(1), v(2), . . . , v(1872), q(1), q(2), . . . , q(117)]. The step S74 multiplies the parity generation matrix H and the estimated information vector.

A step S75 following the step S74 checks whether or not the result of the multiplication by the step S74 is equal to "0". When the multiplication result is equal to "0", it is concluded that the estimated information-code-word bits v(1), v(2), . . . , and v(1872) are correct and are the same as the original ones u(1), u(2), . . . , and u(1872). In this case, the program advances from the step S75 to a step S77. When the multiplication result is not equal to "0", it is concluded that the estimated information-code-word bits v(1), v(2), . . . , and v(1872) are wrong. In this case, the program advances from the step S75 to a step S76.

The step S76 updates the parameters used in the MAP (Maximum A Posteriori Probability) method. After the step S76, the program returns to the step S72.

The step S77 groups the correct information-code-word bits v(1), v(2), . . . , and v(1872) into 6-bit sets handled as information code words C(1), C(2), . . . , and C(312) respectively.

A step S77A subsequent to the step S77 sets a variable "k" to "2". The variable "k" denotes an order number of an information code word which is defined regarding one block. After the step S77A, the program advances to a step S78.

The step S78 gets the delayed information code word C(k−1). The step S78 detects the LSB-side zero run length of the delayed information code word C(k−1). The step S78 accesses the assignment table in response to the detected zero run length, and thereby detects the decision information corresponding to the delayed information code word C(k−1).

A step S79 following the step S78 computes an encoding state S(k) from the current information code word C(k), the delayed information code word C(k−1), and the detected decision information according to the predetermined algorithm.

A step S80 subsequent to the step S79 produces an address signal in response to the delayed information code word C(k−1) and the encoding state S(k). The step S80 accesses the decoding table 60 in response to the address signal. The step S80 reads out an output data word D(k−1) corresponding to the address signal, that is, an output data word D(k−1) corresponding to a set of the delayed information code word C(k−1) and the encoding state S(k), from the encoding table 60. The step S80 feeds the read-out output data word D(k−1) to a next circuit stage or an external device as a recovered original data word D(k−1).

A step S81 following the step S80 checks whether or not the value "k" is equal to "313". When the value "k" is equal to "313", the program advances from the step S81 to a step S83. Otherwise, the program advances from the step S81 to a step S82.

The step S82 increments the value "k" by "1". After the step S82, the program returns to the step S78.

The step S83 determines whether or not the overall decoding procedure should be terminated. When the overall decoding procedure should be terminated, the program exits from the step S83 and then the current execution cycle of the program segment ends. On the other hand, when the overall decoding procedure should not be terminated, the program returns from the step S83 to the step S71 for the decoding of a next block.

What is claimed is:

1. A modulating apparatus comprising:

a set of encoding tables;

first means for modulating "m"-bit input data words into "n"-bit information code words respectively by referring to the encoding tables, wherein "m" denotes a first predetermined natural number equal to an integer multiple of 4 and "n" denotes a second predetermined natural number equal to an integer multiple of 6, and the number "n" is greater than the number "m";

wherein the encoding tables contain information code words assigned to input data words, and contain table selection information accompanying each information code word, wherein the table selection information designates one among the encoding tables which is used next to generate an information code word immediately following the information code word accompanied with the table selection information, and wherein information code words in first specified one of the encoding tables which are assigned to prescribed input data words are opposite in polarity of DSV (digital sum value) to information code words in second specified one of the encoding tables which are assigned to the prescribed input data words;

second means for generating a final information code word in response to a current input data word different from the prescribed input data words by referring to one of the encoding tables;

third means for generating a first candidate information code word in response to a current input data word equal to one of the prescribed input data words by referring to the first specified one of the encoding tables;

fourth means for generating a second candidate information code word in response to the current input data word equal to said one of the prescribed input data words by referring to the second specified one of the encoding tables;

fifth means for generating a first succession of information code words including the final information code word generated by the second means and the first candidate information code word generated by the third means;

sixth means for generating a second succession of information code words including the final information code word generated by the second means and the second candidate information code word generated by the fourth means;

seventh means for calculating a first DSV from the first succession of information code words which is generated by the fifth means;

eighth means for calculating a second DSV from the second succession of information code words which is generated by the sixth means;

ninth means for determining which of an absolute value of the first DSV calculated by the seventh means and an absolute value of the second DSV calculated by the eighth means is smaller;

tenth means for selecting one from the first succession of information code words and the second succession of information code words which corresponds to the smaller DSV absolute value determined by the ninth means as at least a part of a final information-code-word sequence;

eleventh means for generating check bits in response to every block of the final information-code-word sequence and a predetermined parity generation matrix of LDPC (low density parity check) encoding;

twelfth means for converting the check bits generated by the eleventh means into conversion code words respectively, wherein each of the conversion code words includes three bits among which two bits are "0" and one bit is "1"; and thirteenth means for combining every block of the final information-code-word sequence and the related conversion code words generated by the twelfth means into an output-code-word sequence which obeys (1, k) RLL (run length limiting rules), where "k" is a predetermined natural number in the range of 9 to 12.

2. A modulating apparatus as recited in claim 1, wherein a center bit in each of the conversion code words generated by the twelfth means is equal in logic state to a corresponding check bit.

3. A modulating apparatus as recited in claim 1, further comprising fourteenth means for updating the first DSV and the second DSV in response to the conversion code words used by the thirteenth means.

4. A modulating method comprising the steps of:

modulating "m"-bit input data words into "n"-bit information code words respectively by referring to a set of encoding tables, wherein "m" denotes a first predetermined natural number equal to an integer multiple of 4 and "n" denotes a second predetermined natural number equal to an integer multiple of 6, and the number "n" is greater than the number "m";

wherein the encoding tables contain information code words assigned to input data words, and contain table selection information accompanying each information code word, wherein the table selection information designates one among the encoding tables which is used next to generate an information code word immediately following the information code word accompanied with the table selection information, and wherein information code words in first specified one of the encoding tables which are assigned to prescribed input data words are opposite in polarity of DSV (digital sum value) to information code words in second specified one of the encoding tables which are assigned to the prescribed input data words;

generating a final information code word in response to a current input data word different from the prescribed input data words by referring to one of the encoding tables;

generating a first candidate information code word in response to a current input data word equal to one of the prescribed input data words by referring to the first specified one of the encoding tables;

generating a second candidate information code word in response to the current input data word equal to said one of the prescribed input data words by referring to the second specified one of the encoding tables;

generating a first succession of information code words including the final information code word and the first candidate information code word;

generating a second succession of information code words including the final information code word and the second candidate information code word;

calculating a first DSV from the first succession of information code words;

calculating a second DSV from the second succession of information code words;

determining which of an absolute value of the first DSV and an absolute value of the second DSV is smaller;

selecting one from the first succession of information code words and the second succession of information code words which corresponds to the smaller DSV absolute value as at least a part of a final information-code-word sequence;

generating check bits in response to every block of the final information-code-word sequence and a predetermined parity generation matrix of LDPC (low density parity check) encoding;

converting the check bits into conversion code words respectively, wherein each of the conversion code words includes three bits among which two bits are "0" and one bit is "1"; and combining every block of the final information-code-word sequence and the related conversion code words into an output-code-word sequence which obeys (1, k) RLL (run length limiting rules), where "k" is a predetermined natural number in the range of 9 to 12.

5. A modulating method as recited in claim 4, wherein a center bit in each of the conversion code words is equal in logic state to a corresponding check bit.

6. A modulating method as recited in claim 4, further comprising the step of updating the first DSV and the second DSV in response to the conversion code words combined with the block of the final information-code-word sequence.

7. A demodulating apparatus comprising:

first means for implementing a first step of generating an estimated code-word bit sequence from every block of an input-code-word sequence in response to parameters according to a Maximum A Posteriori Probability process, a second step of separating the estimated code-word bit sequence into estimated information code words and estimated conversion code words, a third step of decoding the estimated conversion code words into estimated check bits, a fourth step of performing predetermined operation among the estimated information code words, the estimated check bits, and a predetermined parity generation matrix of LDPC encoding, a fifth step of deciding whether the estimated information code words are correct or wrong in response to a result of the predetermined operation, a sixth step of, when the fifth step decides that the estimated information code words are wrong, updating the parameters and then repeating the first, second, third, fourth, and fifth step, and a seventh step of, when the fifth step decides that the estimated information code words are correct, defining the estimated information code words as recovered information code words;

a decoding table in which output data words are assigned to information code words depending on table selection information;

second means for detecting an LSB-side zero run length of a recovered information code word of interest;

third means for reproducing table selection information, which has been used by a modulating side to generate an information code word corresponding to a recovered information code word immediately following the recovered information code word of interest, in response to the detected LSB-side zero run length and the recovered information code word immediately following the recovered information code word of interest; and fourth means for reading out an output data word corresponding to the recovered information code word of interest from the decoding table in response to the recovered information code word of interest and the table selection information reproduced by the third means.

8. A demodulating apparatus as recited in claim 7, wherein the third step uses center bits in the respective estimated conversion code words as the estimated check bits.

9. A demodulating method comprising the steps of:

1) generating an estimated code-word bit sequence from every block of an input-code-word sequence in response to parameters according to a Maximum A Posteriori Probability process;

2) separating the estimated code-word bit sequence into estimated information code words and estimated conversion code words;

3) decoding the estimated conversion code words into estimated check bits;

4) performing predetermined operation among the estimated information code words, the estimated check bits, and a predetermined parity generation matrix of LDPC encoding;

5) deciding whether the estimated information code words are correct or wrong in response to a result of the predetermined operation;

6) when the step 5) decides that the estimated information code words are wrong, updating the parameters and then repeating the steps 1), 2), 3), 4), and 5);

7) when the step 5) decides that the estimated information code words are correct, defining the estimated information code words as recovered information code words;

8) detecting an LSB-side zero run length of a recovered information code word of interest;

9) reproducing table selection information, which has been used by a modulating side to generate an information code word corresponding to a recovered information code word immediately following the recovered information code word of interest, in response to the detected LSB-side zero run length and the recovered information code word immediately following the recovered information code word of interest; and 10) reading out an output data word corresponding to the recovered information code word of interest from a decoding table in response to the recovered information code word of interest and the table selection information reproduced by the step 9);

wherein the decoding table contains output data words which are assigned to information code words depending on table selection information.

10. A demodulating method as recited in claim 9, wherein the step 3) uses center bits in the respective estimated conversion code words as the estimated check bits.

* * * * *